(12) United States Patent
Asada et al.

(10) Patent No.: US 9,166,770 B2
(45) Date of Patent: Oct. 20, 2015

(54) CLOCK-GENERATING DEVICE AND CLOCK DATA RECOVERY DEVICE

(71) Applicant: THINE ELECTRONICS, INC., Tokyo (JP)

(72) Inventors: Kunihiro Asada, Bunkyo-ku (JP); Tetsuya Iizuka, Bunkyo-ku (JP); Satoshi Miura, Suginami-ku (JP); Yohei Ishizone, Chiyoda-ku (JP); Yoshimichi Murakami, Chiyoda-ku (JP); Shunichi Kubo, Chiyoda-ku (JP); Shuhei Yamamoto, Chiyoda-ku (JP)

(73) Assignee: THINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 14/428,229

(22) PCT Filed: Aug. 6, 2013

(86) PCT No.: PCT/JP2013/071264
§ 371 (c)(1),
(2) Date: Mar. 13, 2015

(87) PCT Pub. No.: WO2014/041924
PCT Pub. Date: Mar. 20, 2014

(65) Prior Publication Data
US 2015/0263850 A1    Sep. 17, 2015

(30) Foreign Application Priority Data

Sep. 14, 2012    (JP) .................................. 2012-203212

(51) Int. Cl.
*H04L 7/00* (2006.01)
*H03K 5/01* (2006.01)
*G06F 1/04* (2006.01)
*H03K 5/00* (2006.01)

(52) U.S. Cl.
CPC ................ *H04L 7/0037* (2013.01); *G06F 1/04* (2013.01); *H03K 5/01* (2013.01); *H03K 2005/00013* (2013.01); *H03K 2005/00286* (2013.01)

(58) Field of Classification Search
CPC ..... H04L 7/033; H04L 7/0337; H04L 7/0814; H04L 7/0338; H04L 7/0008; H04L 7/02; H04L 7/0331; G06F 1/10
USPC ......................... 375/371, 354, 316, 219, 295
See application file for complete search history.

(56) References Cited

U.S. PATENT DOCUMENTS

2009/0243677 A1*  10/2009  Becker et al. .................. 327/158

FOREIGN PATENT DOCUMENTS

JP    2008245273 A    10/2008
JP    201182954 A    4/2011

OTHER PUBLICATIONS

J. Terada, et al., "A 10.3125Gb/s Burst-Mode CDR Circuit using a ΔΣ DAC," IEEE, International, 2008, p. 226-p. 227.
International Preliminary Report on Patentability issued by the International Searching Authority in counterpart International application No. PCT/JP2013/071264, mailed on Mar. 26, 2015.
International Search Report mailed on Oct. 8, 2013 in International Application No. PCT/JP2013/071264.

* cited by examiner

*Primary Examiner* — Zewdu Kassa
(74) *Attorney, Agent, or Firm* — Sughrue Mion, PLLC

(57) ABSTRACT

A clock data recovery device 1 generates a recovered clock Recovered Clock and recovered data Recovered Data based on an input signal Data In, and includes a signal selector 10, a phase delay unit 20, a time measurement unit 30, a phase selector 40, an edge detector 50, a polarity detector 60, a logic inverter 70, and a data output unit 80. The signal selector 10, the phase delay unit 20, the time measurement unit 30, and the phase selector 40 constitute a clock-generation device 1A. The phase delay unit 20 includes a plurality of cascaded delay elements $21_1$ to $21_P$. The phase selector 40 selects a signal output from the delay element in a position corresponding to a unit interval time among the delay elements $21_1$ to $21_P$, and outputs the signal as a feedback clock Feedback Clock.

6 Claims, 19 Drawing Sheets

CLOCK-GENERATING DEVICE AND CLOCK DATA RECOVERY DEVICE

CROSS REFERENCE TO RELATED APPLICATIONS

This application is a National Stage of International Application No. PCT/JP2013/071264 filed Aug. 6, 2013, claiming priority based on Japanese Patent Application No. 2012-203212 filed Sep. 14, 2012, the contents of all of which are incorporated herein by reference in their entirety.

TECHNICAL FIELD

The present invention relates to a clock-generation device that generates a clock, and a clock data recovery device with this clock-generation device.

BACKGROUND ART

For a digital signal in which a clock and data are combined, which is output from a transmitter, it is necessary for the clock and the data to be recovered at a receiver side. A clock data recovery (CDR) device for performing such recovery is described, for example, in Non-Patent Literature 1.

The clock data recovery device described in Non-Patent Literature 1 detects an edge of an input signal, recovers a clock based on a timing of the edge, and recovers data of the input signal at each timing indicated by the clock. A clock-generation device which generates a recovery clock in this clock data recovery device includes a phase lock loop (PLL) including a gated voltage controlled oscillator (GVCO), a frequency divider, a phase difference detector, an up-down counter, and a DA converter using a $\Delta\Sigma$ scheme.

The clock data recovery device described in Non-Patent Literature 1 is a device that operates in a burst mode. That is, the clock-generation device receives a reference clock from the outside before signal input start and during signal input, and outputs a clock at the same frequency as that of the reference clock. When the signal input is started, the clock-generation device matches a phase of the clock with a phase of the input signal in a short time, and outputs the clock.

CITATION LIST

Non-Patent Literature

[Non-Patent Literature 1] J. Terada, et al., "A 10.3125 Gb/s Burst-Mode CDR Circuit using a $\Delta\Sigma$ DAC," ISSCC Dig. Tech. Papers, pp. 226-227 (2008).

SUMMARY OF INVENTION

Technical Problem

Since a clock data recovery device in a burst mode can start recovery of a clock and data in a short time after signal input start, the clock data recovery device is useful when a standby period in which there is no signal input and an operation period in which there is signal input alternate (particularly, during mobile use). However, in this clock data recovery device, since a circuit scale of the clock-generation device is large, and a circuit for generating a reference clock input to the clock-generation device is necessary, manufacturing cost is high. Other devices with such a clock-generation device have the same problems.

The present invention has been made to solve the aforementioned problems, and an object of the present invention is to provide a clock-generation device and a clock data recovery device capable of reducing a circuit scale.

Solution to Problem

A clock-generation device of the present invention includes (1) a signal selector that receives a feedback clock, an edge signal having an edge at a timing according to a bit rate, and an edge detection signal that is at a significance level over a certain period of time including a timing of the edge of the edge signal, selects and outputs the edge signal when the edge detection signal is at the significance level, and selects and outputs a signal obtained by logically inverting the feedback clock when the edge detection signal is at a non-significance level; (2) a phase delay unit including a plurality of cascaded delay elements, the signal output from the signal selector being input to the delay element of a first stage among the plurality of delay elements, and signals having amounts of delay according to respective positions being output from the plurality of respective delay elements; (3) a time measurement unit that measures a unit interval time from a timing of a certain edge of the edge signal to a timing of an edge when a time corresponding to one bit lapses, based on levels of the signals output from the plurality of respective delay elements; and (4) a phase selector that selects the signal output from the delay element in a position corresponding to the unit interval time measured by the time measurement unit among the plurality of delay elements, outputs the signal as the feedback clock, selects the signal output from any delay element among the plurality of delay elements, and outputs the signal as a clock at a frequency corresponding to the bit rate of the edge signal.

The clock-generation device of the present invention may include: phase delay units $D_1$ to $D_N$ as the phase delay unit, time measurement units $M_1$ to $M_N$ as the time measurement unit, and phase selectors $S_1$ to $S_N$ as the phase selector. N is an integer equal to or greater than 2. In this case, each phase delay unit $D_n$ includes a plurality of cascaded delay elements. A delay time of each delay element of each phase delay unit $D_n$ is different from a delay time of each delay element of another phase delay unit $D_{n1}$. n and n1 are integers equal to or greater than 1 and equal to or smaller than N. Each time measurement unit $M_n$ measures the unit interval time based on levels of signals output from the plurality of respective delay elements of the phase delay unit $D_n$. Each phase selector $S_n$ selects the signal output from the delay element in a position corresponding to the unit interval time measured by the time measurement unit $M_n$ among the plurality of delay elements of the phase delay unit $D_n$, and outputs the signal as the feedback clock. The signal selector receives the feedback clock output from the phase selector $S_N$. The signal output from the signal selector is input to a delay element of a first stage in the phase delay unit $D_1$. The feedback clock output from the phase selector $S_{n-1}$ is input to a delay element of a first stage in each phase delay unit $D_n$ other than the phase delay unit $D_1$ among the phase delay units $D_1$ to $D_N$. Any one phase selector $S_n$ among the phase selectors $S_1$ to $S_N$ selects a signal output from any delay element among the plurality of delay elements in the phase delay unit $D_n$, and outputs the signal as the clock.

In the clock-generation device of the present invention, a delay time of the later delay element among the plurality of cascaded delay elements in the phase delay unit may be longer.

A clock data recovery device of the present invention is a device that recovers a clock and data based on an input signal, and includes: (1) the clock-generation device of the present invention; (2) an edge detector that generates and outputs a delayed input signal obtained by giving a delay to the input signal, generates the edge detection signal that is at the significance level over the certain period of time including a timing of an edge of the delayed input signal, and outputs the edge detection signal to the clock-generation device; (3) a polarity detector that generates and outputs a logic inversion instruction signal that is at a significance level when polarities of edges of the feedback clock and the delayed input signal are the same as each other during a period in which the edge detection signal is at the significance level; (4) a logic inverter that outputs a signal obtained by logically inverting the delayed input signal to the clock-generation device as the edge signal when the logic inversion instruction signal is at the significance level, and outputs the delayed input signal to the clock-generation device as the edge signal when the logic inversion instruction signal is at a non-significance level; and (5) a data output unit that samples and holds data of the delayed input signal at a timing indicated by the clock output from the clock-generation device, and outputs the data. Also, clock data recovery device of the present invention outputs the clock output from the clock-generation device as a recovered clock based on the input signal, and outputs the data output from the data output unit as recovered data based on the input signal.

Advantageous Effects of Invention

According to the present invention, it is possible to provide the clock-generation device and the clock data recovery device capable of reducing a circuit scale.

DESCRIPTION OF EMBODIMENTS

Hereinafter, embodiments of the present invention will be described in detail with reference to the accompanying drawings. Further, the same elements are denoted with the same reference signs in description of the drawings, and repeated description will be omitted.

First Embodiment

Figure 1:
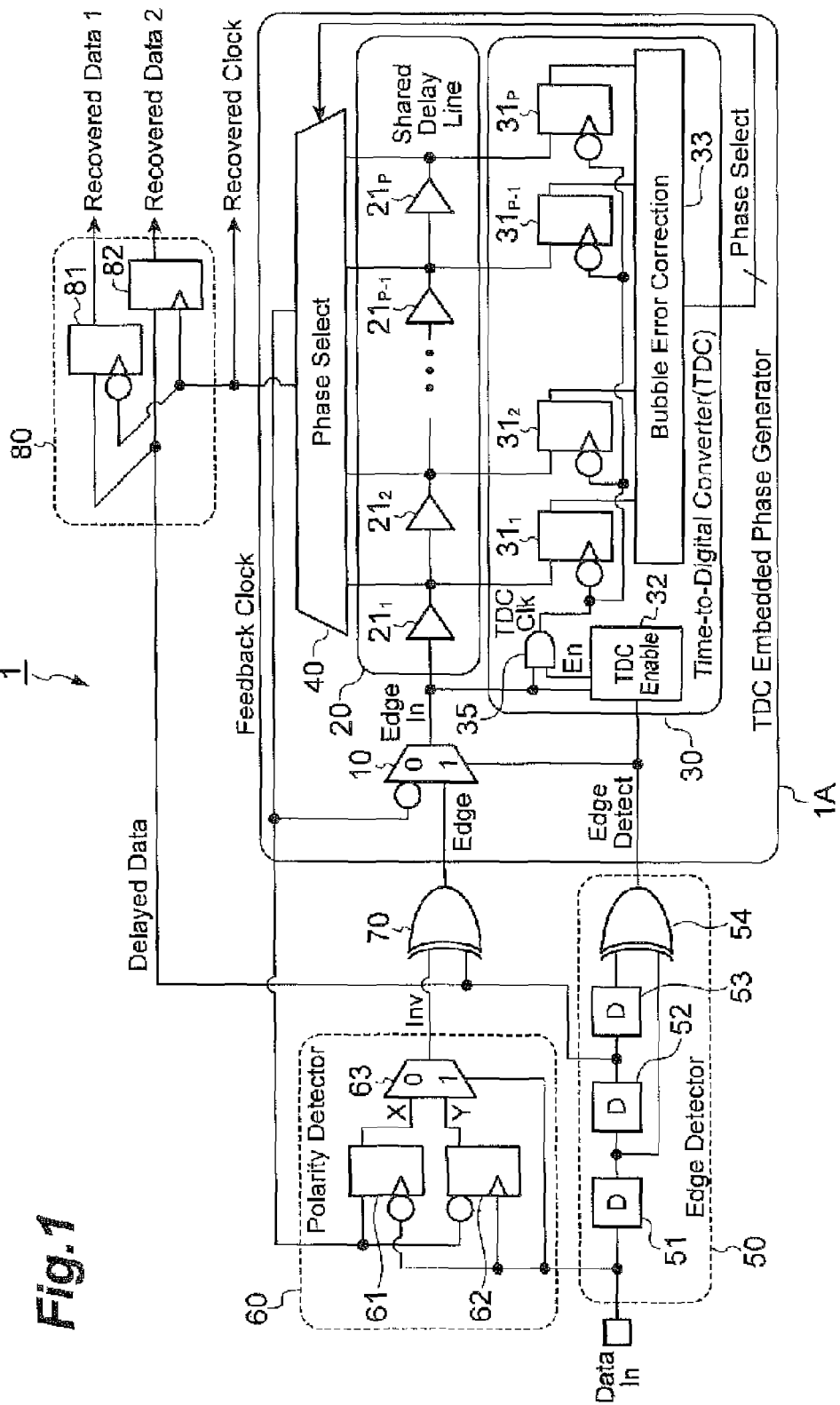
FIG. 1 is a diagram illustrating a configuration of a clock data recovery device 1 of a first embodiment.

FIG. 1 is a diagram illustrating a configuration of a clock data recovery device 1 of a first embodiment. The clock data recovery device 1 generates a recovered clock Recovered Clock and recovered data Recovered Data based on an input signal Data In, and includes a signal selector 10, a phase delay unit 20, a time measurement unit 30, a phase selector 40, an edge detector 50, a polarity detector 60, a logic inverter 70, and a data output unit 80. Among these, the signal selector 10, the phase delay unit 20, the time measurement unit 30, and the phase selector 40 constitute a clock-generation device 1A.

The signal selector 10 receives a feedback clock Feedback Clock output from the phase selector 40, an edge signal Edge output from the logic inverter 70, and an edge detection signal Edge Detect output from the edge detector 50. The edge signal is generated based on the input signal Data In and the feedback clock Feedback Clock, has the same bit rate as the input signal, and has an edge at a timing according to this bit rate. The edge detection signal is a signal that is at a significance level over a certain period of time including a timing of an edge of the edge signal.

When the edge detection signal is at the significance level, the signal selector 10 selects the edge signal, and outputs the edge signal to the phase delay unit 20. That is, when the edge detection signal is at the significance level, the edge signal output from the logic inverter 70 is input to the phase delay unit 20 via the signal selector 10.

On the other hand, when the edge detection signal is at a non-significance level, the signal selector 10 selects a signal obtained by logically inverting the feedback clock, and outputs the signal to the phase delay unit 20. That is, when the edge detection signal is at a non-significance level, the signal selector 10 and the phase selector 20 constitute a feedback loop, and operate like a ring oscillator to perform clock oscillation at a frequency according to the delay time in the phase delay unit 20.

The phase delay unit 20 includes a plurality of (P) cascaded delay elements $21_1$ to $21_P$. The phase delay unit 20 inputs the signal output from the signal selector 10 to the delay element $21_1$ of a first stage among the delay elements $21_1$ to $21_P$. The phase delay unit 20 outputs signals having amounts of delay according to respective positions from the respective delay elements $21_1$ to $21_P$ to the time measurement unit 30 and the phase selector 40. The delay time of the respective delay elements $21_1$ to $21_P$ may be constant.

The time measurement unit 30 measures a unit interval time from a timing of a certain edge of the edge signal to a timing of the edge when a time corresponding to 1 bit lapses, based on levels of the signal outputs from the respective delay elements $21_1$ to $21_P$ of the phase delay unit 20. The time measurement unit 30 constitutes a time-to-digital converter (TDC) capable of outputting a time measurement result as a digital value. Also, the time measurement unit 30 includes flip flops $31_1$ to $31_P$, a measurement permission unit 32, an AND circuit 35 and, for example, a bubble error corrector 33.

The flip flops $31_1$ to $31_P$ constitute a latch unit that latches data of the signals output from the respective delay elements $21_1$ to $21_P$ at a predetermined timing. That is, the $p^{th}$ flip flop $31_p$ among the P flip flops $31_1$ to $31_P$ latches the data of the signal output from the corresponding delay element $21_p$ at a timing of the edge of the signal Edge In output from the signal selector 10 and at a timing permitted by the measurement permission unit 32. The measurement permission unit 32 receives the signal Edge In output from the signal selector 10, receives the edge detection signal Edge Detect output from the edge detector 50, determines whether to permit a latch operation of the flip flops $31_1$ to $31_P$, and outputs a signal En that reaches a significance level when permitting the latch operation. When the signal En output from the measurement permission unit 32 is at the significance level, the AND circuit 35 gives the signal Edge In output from the signal selector 10 to the flip flops $31_1$ to $31_P$.

The bubble error corrector 33 is provided as a countermeasure against bubbles of the P-bit digital data latched and output from the flip flops $31_1$ to $31_P$, and performs bubble error correction on this P-bit digital data. The time measurement unit 30 outputs the P-bit digital data output from the bubble error corrector 33 to the phase selector 40 as a unit interval time measurement result.

The phase selector 40 selects a signal output from the delay element in the position corresponding to the unit interval time measured by the time measurement unit 30 among the delay elements $21_1$ to $21_P$ of the phase delay unit 20, and outputs this signal to the signal selector 10 and the polarity detector 60 as a feedback clock Feedback Clock. Further, the phase selector 40 selects the signal output from any delay element among the delay elements $21_1$ to $21_P$ of the phase delay unit 20, and outputs this signal to the data output unit 80 as a recovered clock Recovered Clock of the frequency corresponding to the bit rate of the edge signal. The recovered clock and the feedback clock are clocks recovered together based on the input signal, and have the same frequency, but have different phases.

The edge detector 50 receives the input signal Data In, generates a delayed input signal (delayed Data) obtained by giving delay to this input signal, and outputs this delayed input signal to the logic inverter 70 and the data output unit 80. Further, the edge detector 50 generates an edge detection signal Edge Detect that is at a significance level over a certain period of time including a timing of an edge of the delayed input signal, and outputs this edge detection signal to the signal selector 10 and the measurement permission unit 32. The edge detector 50 includes cascaded delay elements 51 to 53, and an XOR circuit 54. It is preferable for a delay time D of each of the delay elements 51 to 53 to be constant.

The XOR circuit 54 receives a signal obtained by delaying the input signal by a delay time D using the delay element 51 and a signal obtained by delaying the input signal by a delay time 3D using the delay elements 51 to 53, and outputs a signal indicating an exclusive logical sum of the two signals as an edge detection signal. Further, the edge detector 50 outputs the signal obtained by delaying the input signal by a delay time 2D using the delay elements 51 and 52 as a delayed input signal.

The polarity detector 60 receives the input signal Data In and receives the feedback clock Feedback Clock output from the phase selector 40. Also, the polarity detector 60 generates a logic inversion instruction signal INV based on these signals, and outputs this logic inversion instruction signal to the logic inverter 70. The logic inversion instruction signal reaches a significance level when polarities of edges of the feedback clock Feedback Clock and the delayed input signal Delayed Data are the same as each other during a period in which the edge detection signal Edge Detect is at a significance level. The polarity detector 60 includes flip flops 61 and 62, and a selector 63.

The one flip flop 61 latches the level of the feedback clock at a timing of a falling edge of the input signal. The other flip flop 62 latches a level obtained by inverting the level of the feedback clock at a timing of a rising edge of the input signal. The selector 63 outputs a signal (X) output from the flip flop 61 as the logic inversion instruction signal when the input signal is at a low level, and outputs a signal (Y) output from the flip flop 62 as a logic inversion instruction signal when the input signal is at a high level.

The logic inverter 70 receives the delayed input signal Delayed Data output from the edge detector 50, and receives the logic inversion instruction signal INV output from the polarity detector 60. When the logic inversion instruction signal is at a significance level, the logic inverter 70 outputs a signal obtained by logically inverting the delayed input signal as an edge signal to the clock-generation device. On the other hand, when the logic inversion instruction signal is at a non-significance level, the logic inverter 70 outputs the delayed input signal as an edge signal to the clock-generation device.

The data output unit 80 receives the recovered clock Recovered Clock output from the phase selector 40, and receives the delayed input signal Delayed Data output from the edge detector 50. Also, the data output unit 80 samples and holds data of the delayed input signal at a timing indicated by the recovered clock, and outputs resultant data as recovered data. The data output unit 80 includes flip flops 81 and 82. The flip flop 81 samples and holds the data of the delayed input signal at a timing of the falling edge of the recovered clock, and outputs the data. The flip flop 82 samples and holds the data of the delayed input signal at a timing of the rising edge of the recovered clock, and outputs the data.

Figure 2:
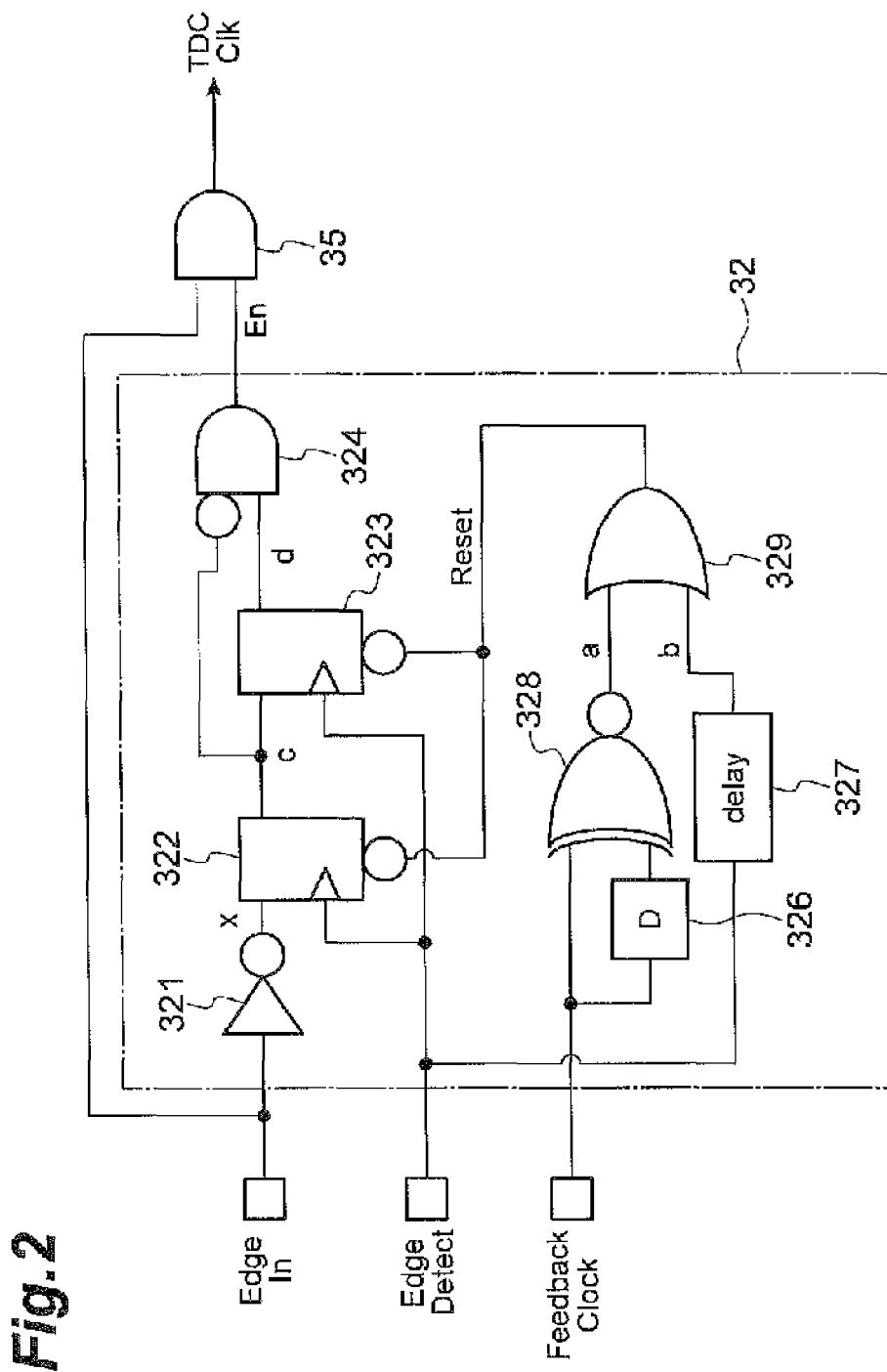
FIG. 2 is a diagram illustrating a circuit configuration example of a measurement permission unit 32 of a time measurement unit 30.

FIG. 2 is a diagram illustrating a circuit configuration example of the measurement permission unit 32 of the time measurement unit 30. The measurement permission unit 32 outputs a signal En that creates a signal TDC Clk indicating a timing of the latch operation of the flip flops $31_1$ to $31_P$, and includes an INV circuit 321, flip flops 322 and 323, an AND circuit 324, delay elements 326 and 327, an EXNOR circuit 328, and an OR gate 329. An AND circuit 35 is also illustrated in FIG. 2.

The flip flop 322 latches a signal (x) obtained by the INV circuit 321 logically inverting the signal Edge In output from the signal selector 10 at a timing of a rising edge of the edge detection signal Edge Detect. The flip flop 323 latches the signal c output from the flip flop 323 at a timing of a rising edge of the edge detection signal Edge Detect. When a signal Reset output from the OR gate 329 is at a low level, the flip flops 322 and 323 are initialized.

The AND circuit 324 receives a signal obtained by logically inverting the signal c output from the flip flop 323 and a signal d output from the flip flop 324, and outputs the signal En indicating a logical product of the two signals. The AND circuit 35 outputs a signal TDC Clk indicating a logical product of the signal En output from the AND circuit 324 and the signal Edge In output from the signal selector 10.

The EXNOR circuit 328 receives the recovered clock Recovered Clock and a signal obtained by the delay element 326 delaying this recovered clock, and outputs a signal a indicating inversion of exclusive logical sum of the two signals. The OR gate 329 receives the signal a output from the EXNOR circuit 328 and a signal obtained by the delay element 327 delaying the recovered clock, and outputs a signal Reset indicating logical sum of the signals to the flip flops 322 and 323.

Figure 3:
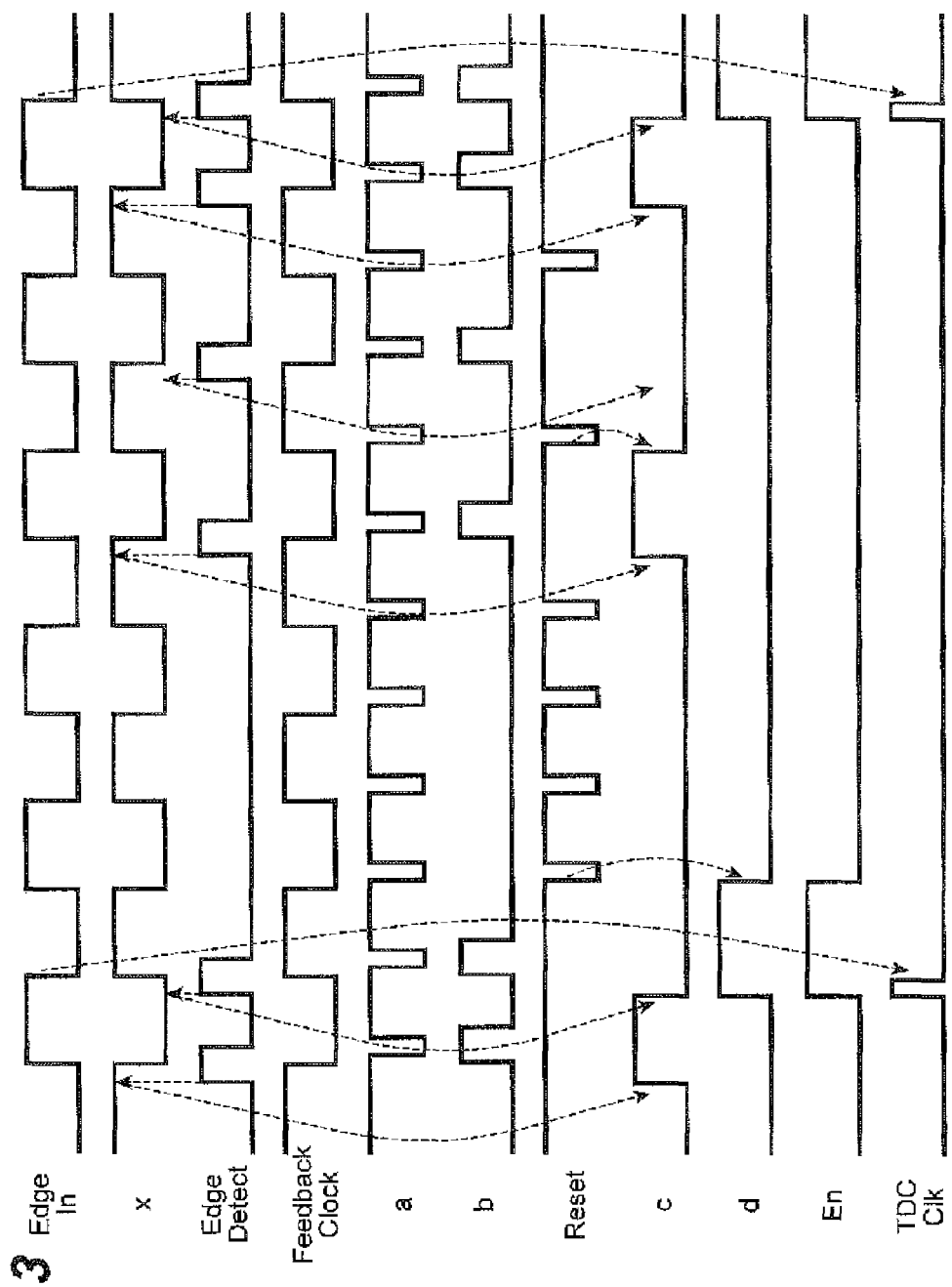
FIG. 3 is a timing chart of respective signals in the measurement permission unit 32 of the time measurement unit 30.

FIG. 3 is a timing chart of respective signals in the measurement permission unit 32 of the time measurement unit 30. The measurement permission unit 32 finds a rising edge (transition of level 0→1) and a falling edge (transition of level 1→0) in the signal Edge In output from the signal selector 10, and outputs the signal TDC Clk indicating a timing of the latch operation of the flip flops $31_1$ to $31_P$. The INV circuit 321 and the flip flops 322 and 323 latch the signal (x) obtained by inverting the signal Edge In at a timing of the rising edge of the edge detection signal Edge Detect to confirm a polarity of the edge of the signal Edge In (whether the edge is rising or falling).

The AND circuit 324 and the AND circuit 35 cause the signal En to be at a high level only when the signals c and d are at a low level and a high level, respectively, and output the signal Edge In as the signal TDC Clk. The delay elements 326 and 327, the EXNOR circuit 328, and the OR gate 329 combine the feedback clock Feedback with the edge detection signal Edge Detect, and reset the flip flops 322 and 323 when the interval between the edges exceeds one unit interval time to thereby instruct the latch operation of the flip flops $31_1$ to $31_P$ only when the rising edge and the falling edge are at intervals of one unit interval time.

Figure 4:
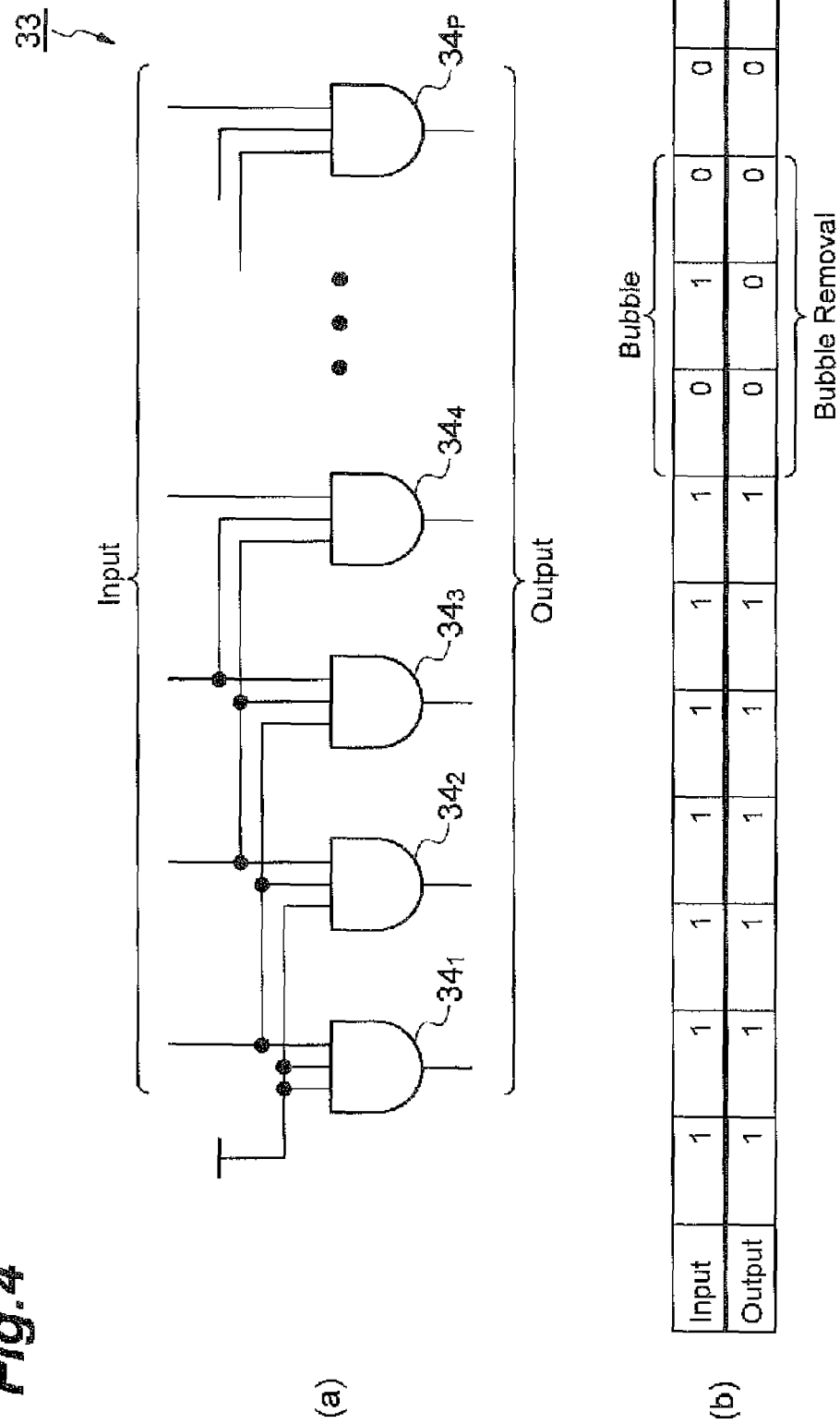
FIG. 4 is an illustrative diagram of a bubble error corrector 33 of the time measurement unit 30.

FIG. 4 is an illustrative diagram of the bubble error corrector 33 of the time measurement unit 30. The bubble error corrector 33 is provided for the purpose of meta-stability of the P-bit digital data latched and output from the flip flops $31_1$ to $31_P$. The bubble error corrector 33 performs bubble error correction on the P-bit digital data so that only one transition from value 1 to value 0 occurs as in [11 . . . 1100 . . . 00].

The bubble error corrector 33 includes P AND circuits $34_1$ to $34_P$ with three inputs, as illustrated in FIG. 4(a). The AND circuit $34_1$ receives the signal output from the delay element $21_1$ and outputs the signal as it is. The AND circuit $34_2$ receives the signals output from the respective delay elements $21_1$ and $21_2$, and outputs a signal indicating a logical product of the two signals. Each AND circuit $34_p$ other than the AND circuits $34_1$ and $34_2$ among the P AND circuits $34_1$ to $34_P$ receives the signals output from the respective delay elements $21_{p-2}$, $21_{p-1}$, and $21_p$, and outputs a signal indicating the logical product of the three signals.

For example, when the P-bit digital data [ . . . 11101000 . . . ] output from the flip flops $31_1$ to $31_P$ is received, the bubble error corrector 33 converts this P-bit digital data to P-bit digital data [ . . . 11100000 . . . ] and outputs the P-bit digital data [ . . . 11100000 . . . ], as shown in an example of input and output signals in FIG. 4(b).

Figure 5:
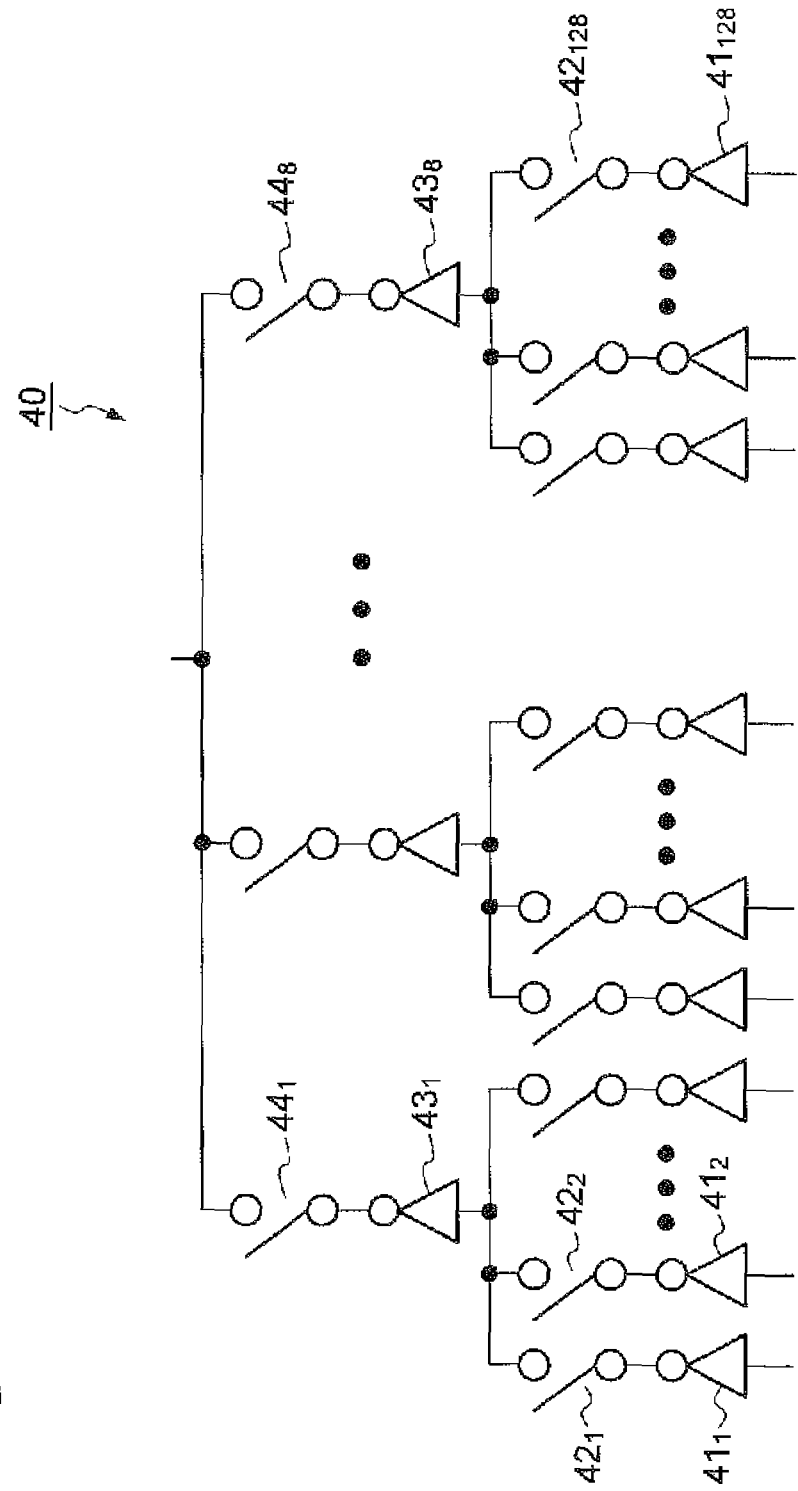
FIG. 5 is a diagram illustrating a circuit configuration example of a phase selector 40.

FIG. 5 is a diagram illustrating a circuit configuration example of the phase selector 40. The phase selector 40 includes a feedback clock selection circuit for selecting and outputting the feedback clock, and a recovered clock selection circuit for selecting and outputting the recovered clock. The feedback clock selection circuit and the recovered clock selection circuit may have the same configuration. In FIG. 5, the feedback clock selection circuit in which P=128 is illustrated.

The feedback clock selection circuit includes 128 INV circuits $41_1$ to $41_{128}$, 128 switches $42_1$ to $42_{128}$, 8 INV circuits $43_1$ to $43_8$, and 8 switches $44_1$ to $44_8$. One set of an INV circuit 43 and a switch 44 is provided for the eight sets of the INV circuits 41 and the switches 42.

Each INV circuit $41_p$ receives the signal output from the corresponding delay element $21_p$, and outputs a signal obtained by logically inverting the signal to the corresponding switch $42_p$. When each switch $42_p$ is closed, the switch $42_p$ inputs the signal output from the corresponding INV circuit $41_p$ to any one INV circuit $43_{p1}$ among the eight INV circuits $43_1$ to $43_8$. Each INV circuit $43_{p1}$ outputs a signal obtained by logically inverting the input signal to the corresponding switch $44_{p1}$. When each switch $44_{p1}$ is closed, the switch $44_{p1}$ outputs the signal output from the corresponding INV circuit $43_{p1}$ as the feedback clock.

The feedback clock selection circuit is able to select the signal output from the delay element in the position corresponding to the unit interval time and output this signal as the feedback clock by closing the switch $42_p$ corresponding to the delay element in the position corresponding to the unit interval time among the delay elements $21_1$ to $21_P$ of the phase delay unit 20, closing the switch $44_{p1}$ in a subsequent stage of this switch $42_p$, and opening the other switches.

Figure 6:
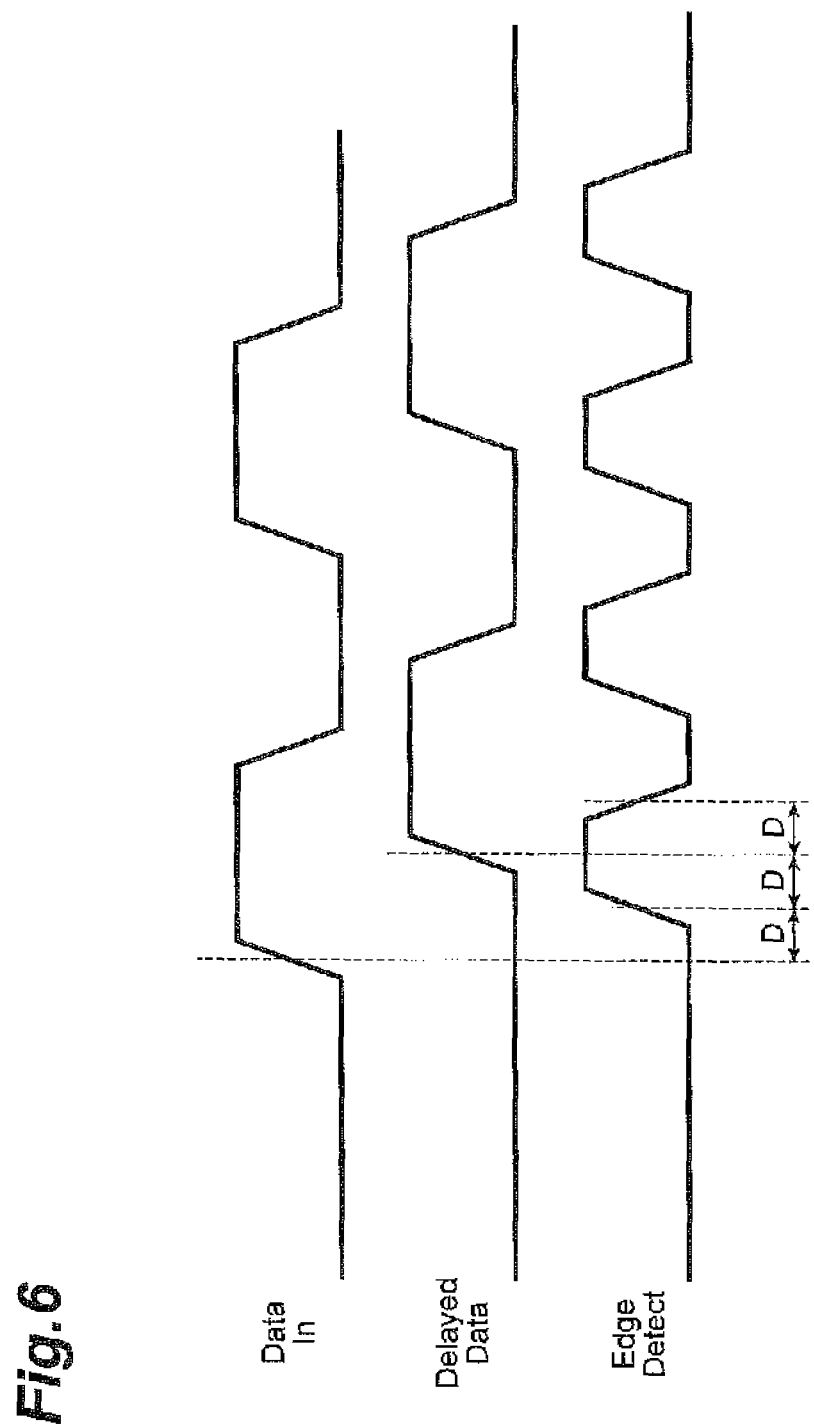
FIG. 6 is a timing chart of respective signals in an edge detector 50.

FIG. 6 is a timing chart of respective signals in the edge detector 50. The delayed input signal Delayed Data is a signal obtained by delaying the input signal Data In by a time D. The edge detection signal is at a significance level over a period of a time 2D with its center at a timing of each edge of the delayed input signal.

Figure 7:
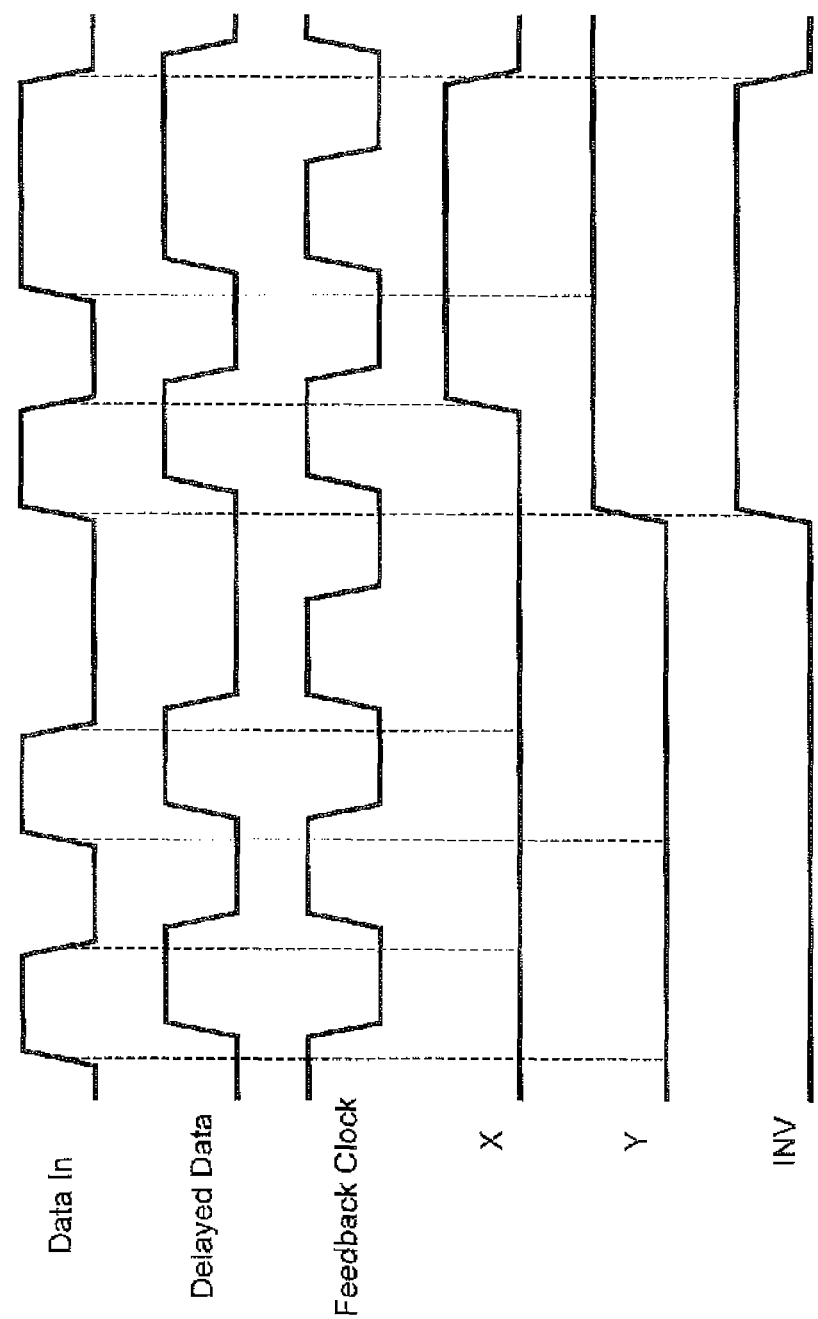
FIG. 7 is a timing chart of respective signals in a polarity detector 60 and a logic inverter 70.

FIG. 7 is a timing chart of respective signals in the polarity detector 60 and the logic inverter 70. The input signal Data In, the delayed input signal Delayed Data, the feedback clock Feedback Clock, the signal (X) output from the flip flop 61 of the polarity detector 60, the signal (Y) output from the flip flop 62 of the polarity detector 60, and the logic inversion instruction signal INV output from the selector 63 of the polarity detector 60 are illustrated in FIG. 7. When polarities of the edges of the feedback clock and the delayed input signal are the same as each other, the logic inversion instruction signal reaches a significance level, as illustrated in FIG. 7.

Figure 8:
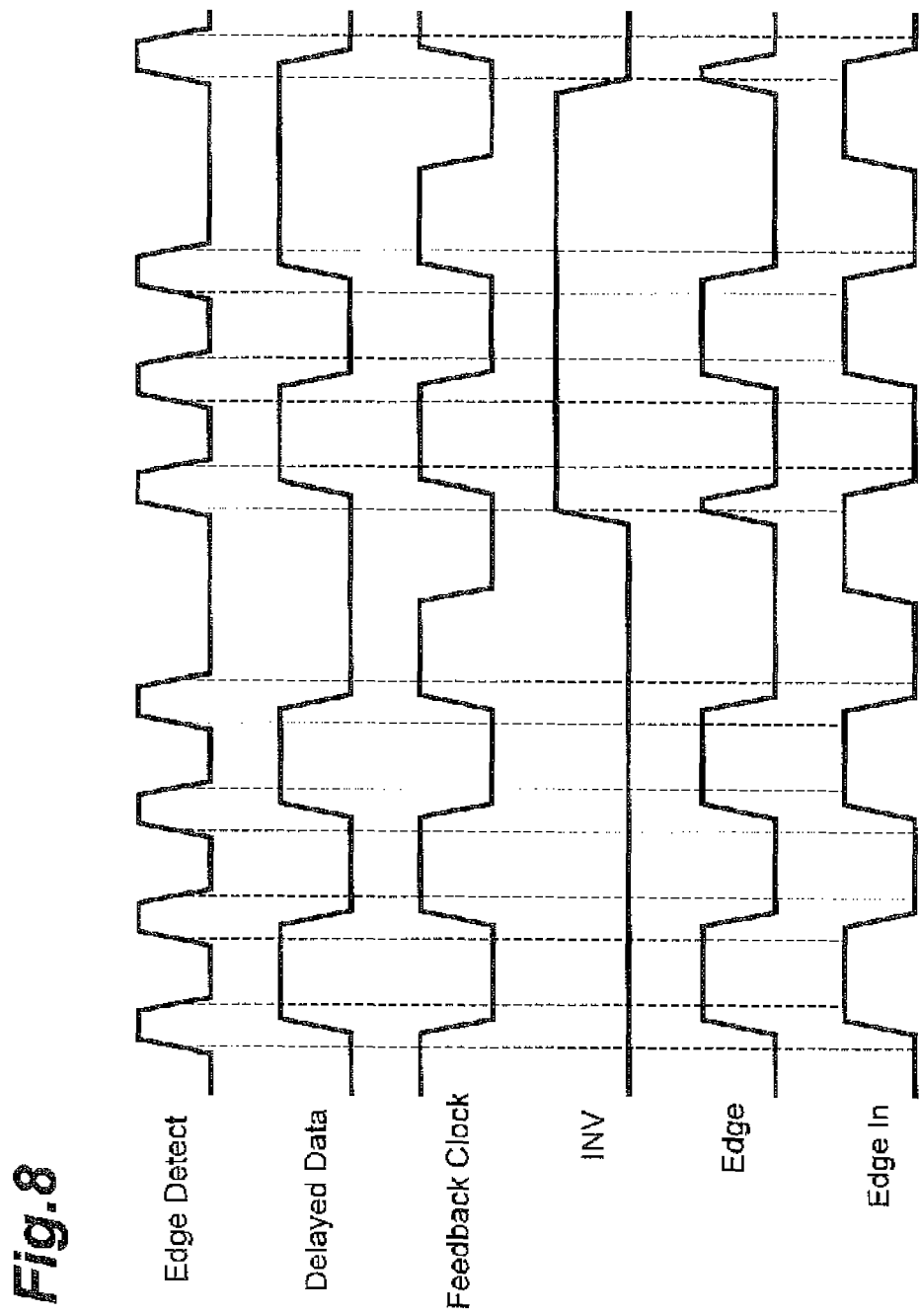
FIG. 8 is a timing chart of respective signals in the logic inverter 70 and a signal selector 10.

FIG. 8 is a timing chart of respective signals in the logic inverter 70 and the signal selector 10. The edge detection signal Edge Detect, the delayed input signal Delayed Data, the feedback clock Feedback Clock, the logic inversion instruction signal INV, the edge signal Edge output from the logic inverter 70 and input to the signal selector 10, and the signal Edge In output from the signal selector 10 are illustrated in FIG. 8. As illustrated in FIG. 8, polarities of edges of the edge signal and the feedback clock are opposite to each other during a period in which the edge detection signal is at a significance level (a certain period of time including the timing of the edge of the delayed input signal), the signal Edge In output from the signal selector 10 becomes the same as a signal obtained by logically inverting the feedback clock, and clock oscillation is maintained.

Figure 9:
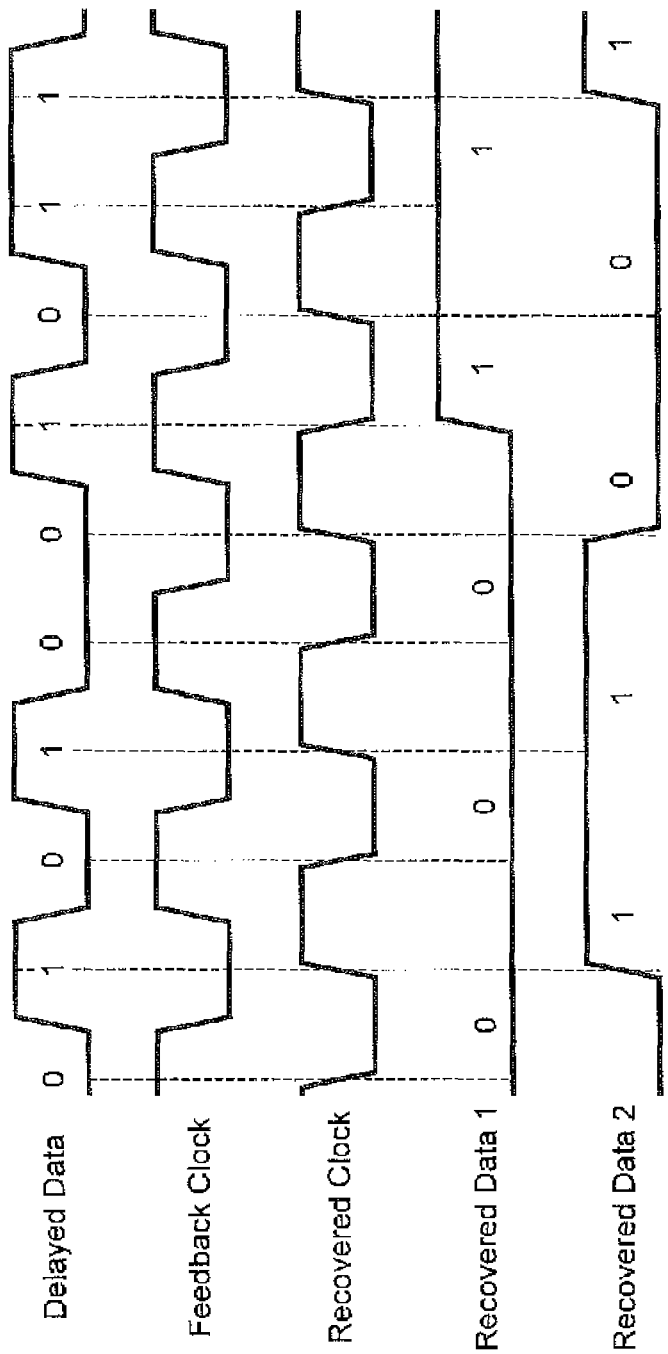
FIG. 9 is a timing chart of respective signals in a data output unit 80.

FIG. 9 is a timing chart of respective signals in the data output unit 80. The delayed input signal Delayed Data, the feedback clock Feedback Clock, the recovered clock Recovered Clock, the recovered data Recovered Data1 output from the flip flop 81, and the recovered data Recovered Data2 output from the flip flop 82 are illustrated in FIG. 9. As illustrated in FIG. 9, the feedback clock and the recovered clock have the same frequency, but have different phases. The frequency of the feedback clock and the recovered clock becomes half of the bit rate of the delayed input signal (that is, the bit rate of the input signal). The phase of the recovered clock (that is, the timing of the edge of the recovered clock) is set so that there is no sampling error of the data of the delayed input signal in the data output unit 80. A difference between the phases of the feedback clock and the recovered clock is, for example, $\pi/2$.

Figure 10:
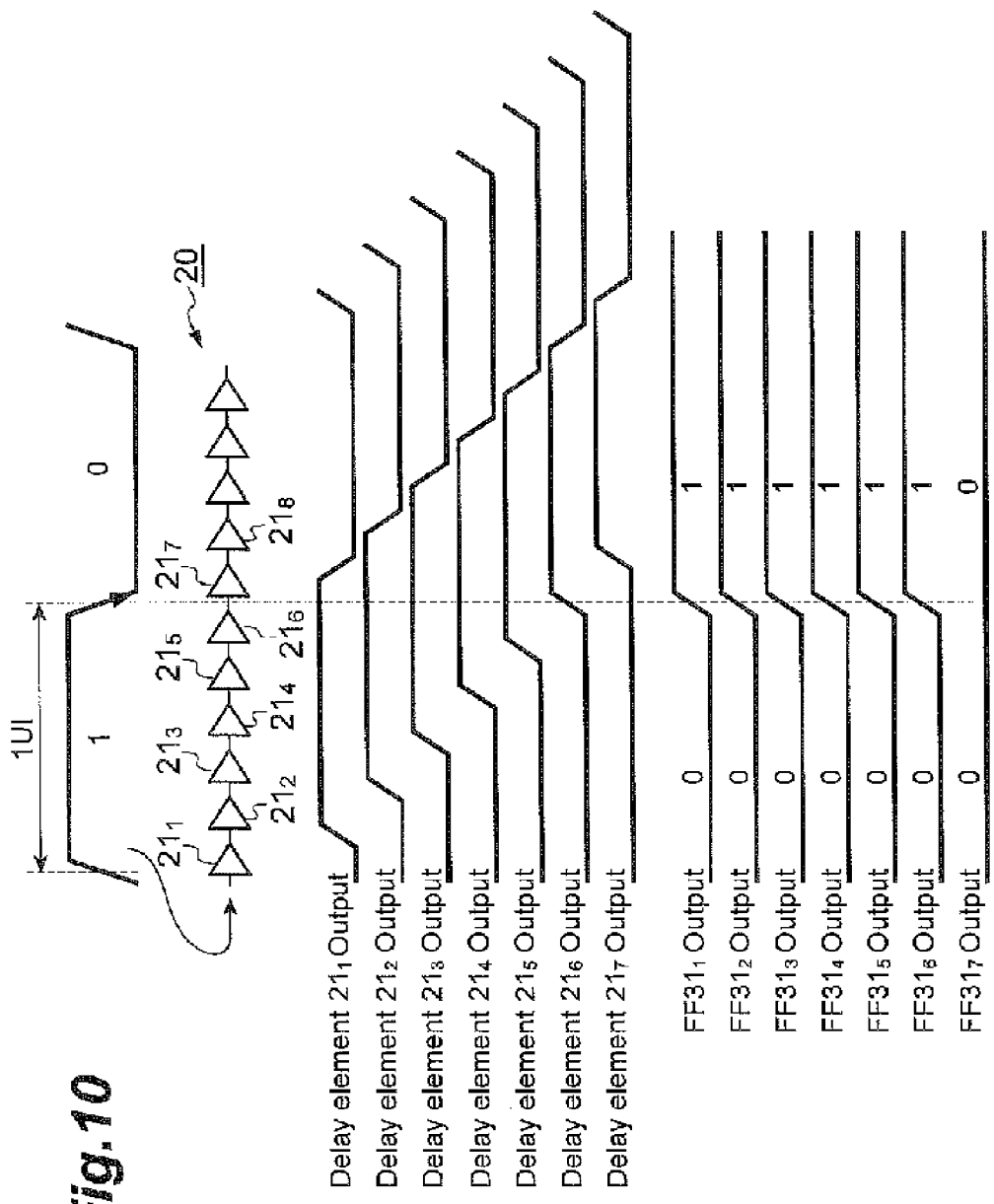
FIG. 10 is a timing chart of respective signals in a phase delay unit 20 and a time measurement unit 30 of a clock-generation device 1A.

Next, the clock-generation device 1A will be described in greater detail. FIG. 10 is a timing chart of respective signals in the phase delay unit 20 and the time measurement unit 30 of the clock-generation device 1A. FIG. 10 illustrates a timing chart of signals output from the respective delay elements $21_1$ to $21_P$ of the phase delay unit 20 and the respective flip flops $31_1$ to $31_P$ of the time measurement unit 30 when 3-bit data [010] is input as the signal Edge In output from the signal selector 10.

For example, when the logic inversion instruction signal INV is at a non-significance level and 3-bit data [010] is input as an input signal, the delayed input signal Delayed Data has a rising edge, and has a falling edge when the unit interval time lapses from this rising edge. The edge detection signal Edge Detect reaches a significance level over a certain period of time including respective timings of the two edges of the delayed input signal. Therefore, the same 3-bit data [010] as the delayed input signal is selected as an edge signal Edge by the signal selector 10 and is input to the phase delay unit 20.

The timing of the rising edge of the signal Edge In output from the signal selector 10 is a reference time, and the delay time of each delay element $21_n$ is $\tau$. In this case, at a time point at which a time $M\tau$ (which is a time shorter than the unit interval time) passes from the reference time, the signals output from the delay elements $21_1$ to $21_m$ from the first stage to the $m^{th}$ stage among the delay elements $21_1$ to $21_P$ are at a high level, and the signals output from the delay elements $21_{m-1}$ to $21_P$ of subsequent stages are at a low level.

At a time point at which the unit interval time passes from the reference time (a timing of the falling edge of the signal Edge In output from the signal selector 10), when the signals output from the delay elements $21_1$ to $21_m$ from the first stage to the $m^{th}$ stage among the delay elements $21_1$ to $21_P$ are at a high level, and the signals output from the delay elements $21_{m-1}$ to $21_P$ of subsequent stages are at a low level, the unit interval time can be seen to be equal to or greater than $M\tau$ and smaller than $(m+1)\tau$.

At a timing of the falling edge of the signal Edge In output from the signal selector 10, each flip flop $31_p$ latches the data of the signal output from the corresponding delay element $21_p$. Then, the signals output from the respective flip flops $31_1$ to $31_m$ from the first stage to the $m^{th}$ stage among the flip flops $31_1$ to $31_P$ are at a high level, and the signals output from the respective flip flops $31_{m-1}$ to $31_P$ of the subsequent stages are at a low level.

The p-bit digital data latched and output by the P flip flops $31_1$ to $31_P$ is [11 . . . 1100 . . . 00] in which the first bit to the $p^{th}$ bit have a value 1, and other (P–p) bits have a value 0. The time measurement unit 30 obtains the unit interval time from the P-bit digital data. Also, the phase selector 40 selects the signal output from the delay element in the position corresponding to the unit interval time among the P delay elements $21_1$ to $21_P$, outputs the signal as a feedback clock Feedback Clock, and outputs the recovered clock Recovered Clock.

Figure 11:
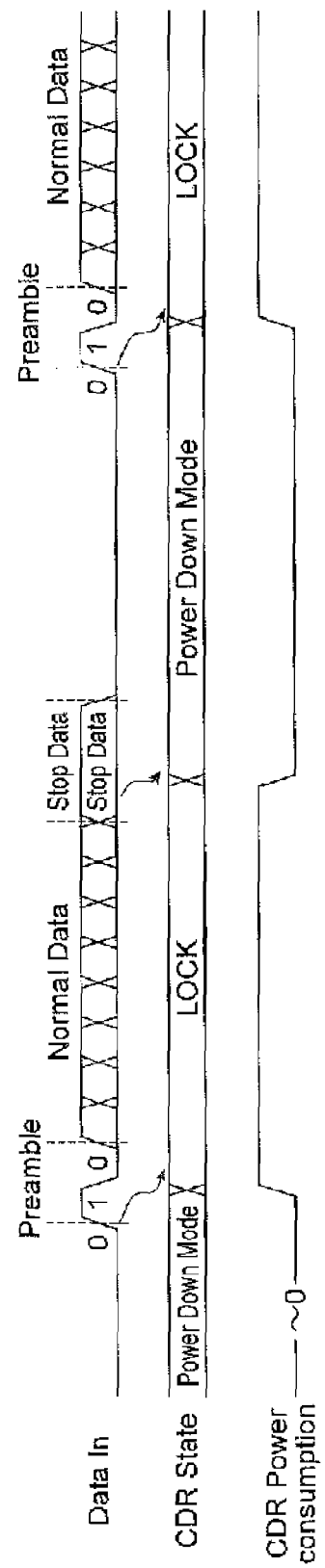
FIG. 11 is a diagram illustrating an operation sequence of the clock data recovery device 1 of the first embodiment.

FIG. 11 is a diagram illustrating an operation sequence of the clock data recovery device 1 of the first embodiment. A waveform of the input signal Data In input to the clock data recovery device 1, a state of the clock data recovery device 1, and power consumption of the clock data recovery device 1 are illustrated in FIG. 11. An operation period in which the input signal Data In is input and a standby period in which there is no signal input alternate, as illustrated in FIG. 11. The input signal includes normal data (Normal data), a preamble (Preamble) added before the normal data, and stop data (Stop Data) added after the normal data.

In the standby period in which there is no signal input, the input signal remains at the value 0, the clock data recovery device 1 is in a power down mode, and there is no substantial power consumption. When the standby period ends, [10] is first input as data of the preamble of the input signal. Accordingly, the clock data recovery device 1 enters a lock state in which oscillation of the recovered clock Recovered Clock and the feedback clock Feedback Clock at a frequency corresponding to the unit interval time of the data of the preamble as described above is obtained, and a clock and data can be recovered. Also, the recovered clock and recovered data are obtained based on the normal data that is input following the preamble. The stop data added after the normal data is, for example, data in which values 1 of a certain number or more of bits continue. When this stop data is input, the clock data recovery device 1 recognizes that the operation period ends and the standby period arrives, and enters the power down mode, and there is no substantial power consumption.

Figure 12:
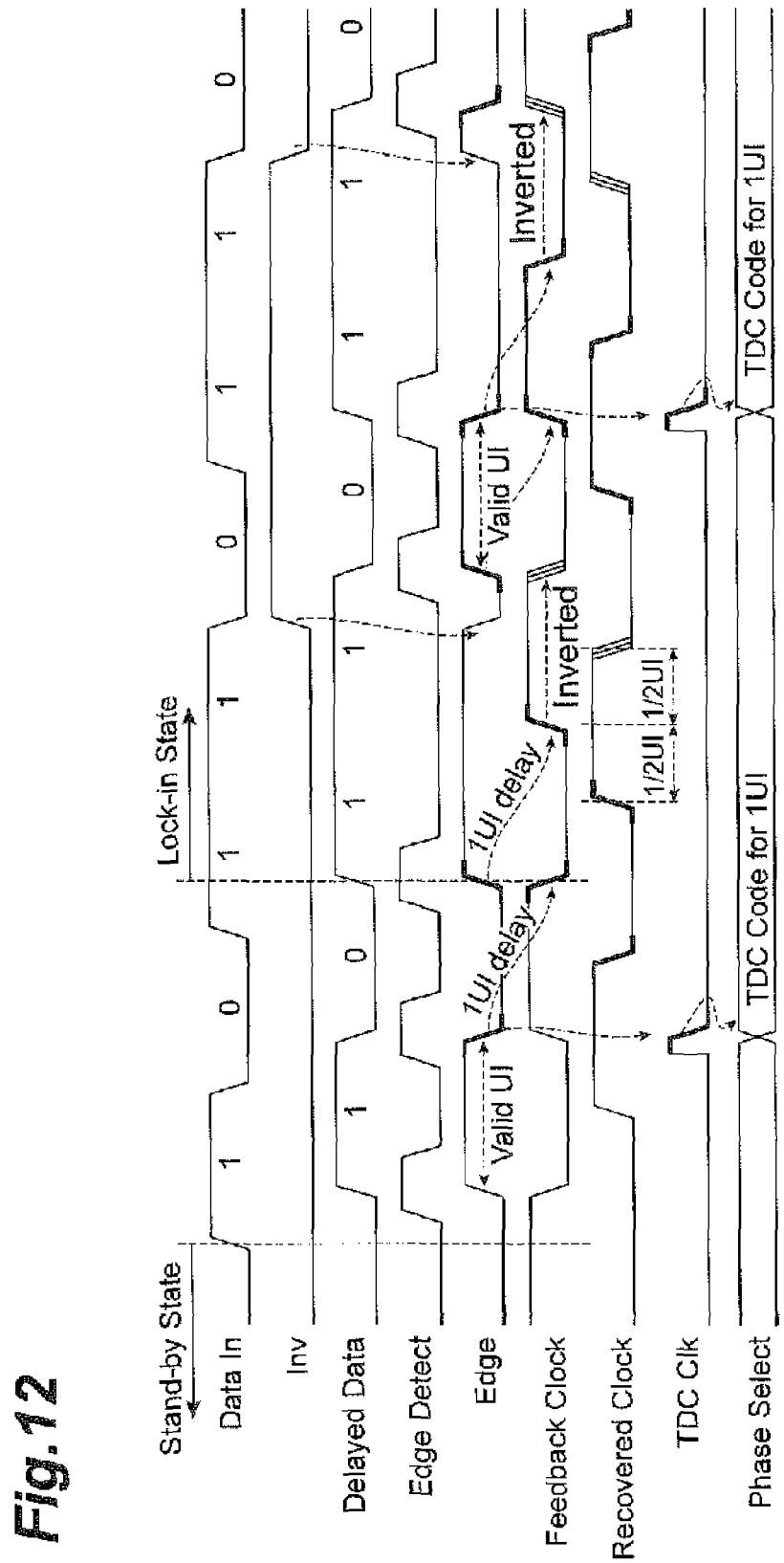
FIG. 12 is a timing chart of respective signals in the clock data recovery device 1 of the first embodiment.

FIG. 12 is a timing chart of respective signals in the clock data recovery device 1 of the first embodiment. The input signal Data In, the logic inversion instruction signal INV, the delayed input signal Delayed Data, the edge detection signal Edge Detect, the edge signal Edge, the feedback clock Feedback Clock, the recovered clock Recovered Clock, the signal TDC Clk indicating a timing of the latch operation, and a signal Phase Select indicating the unit interval time measured by the time measurement unit 30 and given to the phase selector 40 are illustrated in FIG. 12. Further, a period in which the preamble and the normal data are input as input signals is illustrated in FIG. 12.

When 2-bit data [10] of the preamble is input, the clock data recovery device 1 enters a lock state, and the recovered clock and the recovered data can be obtained based on the normal data following the preamble. As described using FIG. 8, when there is an edge in the input signal, the clock data recovery device 1 can match the phase of the recovered clock Recovered Clock with the phase of the input signal by causing the edge to be input to the phase delay unit 20.

Further, in the clock data recovery device 1, when the normal data (Normal Data) is transmitted and there is 3-bit data [010] in the signal Edge In output from the signal selector 10, the unit interval time is measured by the time measurement unit 30, such that a clock oscillation frequency can be adjusted based on this measured unit interval time. Accordingly, it is possible to perform an operation of normally recovering the clock and the data even when characteristics of each delay element of the phase delay unit 20 change due to a change in temperature or voltage during an operation or a bit rate of the input signal slowly changes.

As described above, in the clock data recovery device 1 and the clock-generation device 1A of the first embodiment, since a PLL is unnecessary or a circuit for generating a reference clock is unnecessary, it is possible to reduce a circuit scale and to reduce a manufacturing cost. Further, in the clock data recovery device 1 and the clock-generation device 1A of this embodiment, it is possible to reduce power consumption in the standby period in which there is no signal input. Further, the clock data recovery device 1 of this embodiment can start the recovery of the clock and the data in a short time after the signal input starts.

Second Embodiment

Figure 13:
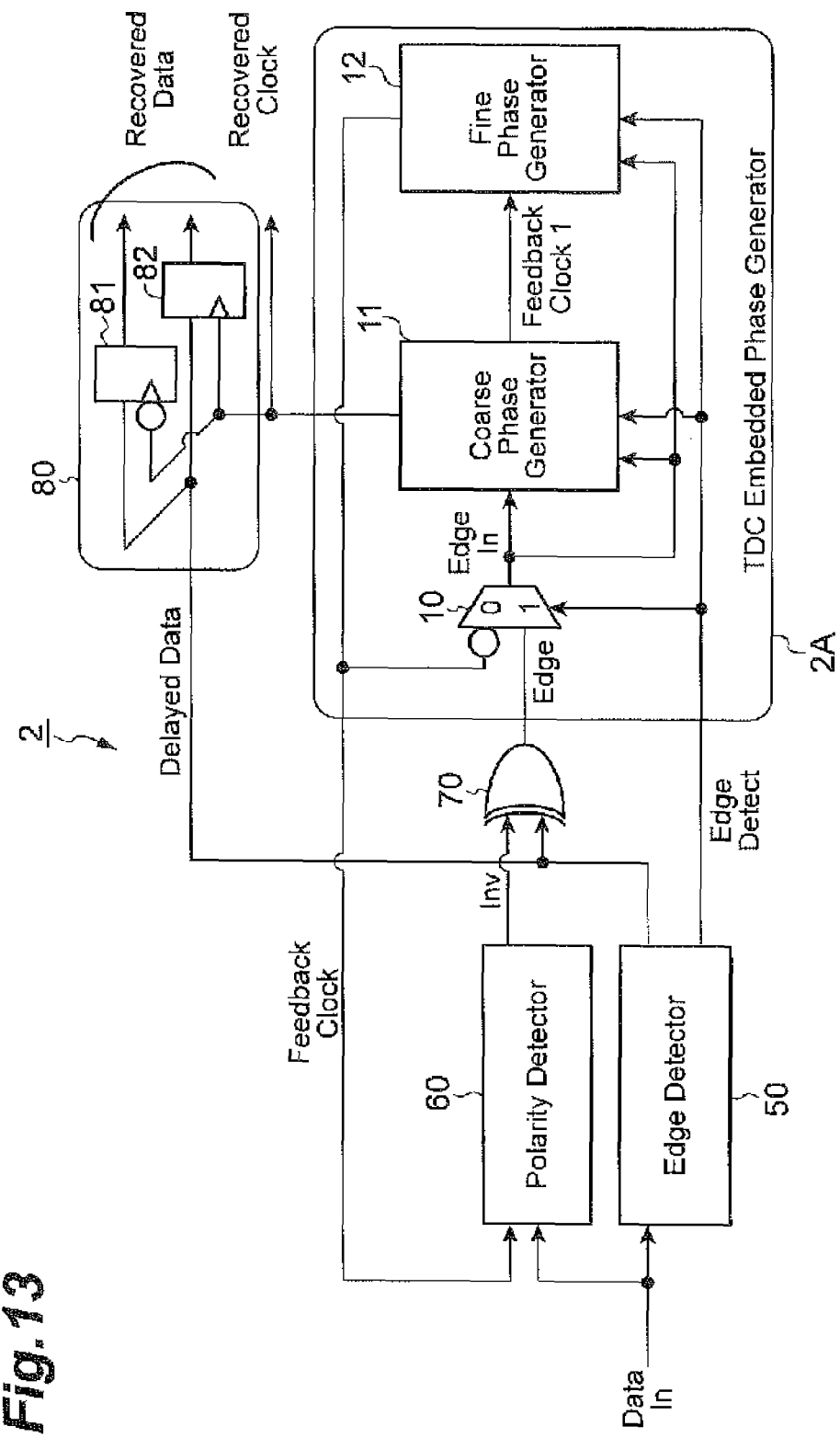
FIG. 13 is a diagram illustrating a configuration of a clock data recovery device 2 of the second embodiment.

FIG. 13 is a diagram illustrating a configuration of a clock data recovery device 2 of a second embodiment. A configuration of the clock data recovery device 2 of the second embodiment is the same as the configuration of the clock data recovery device 1 of the first embodiment illustrated in FIG. 1 in that the clock data recovery device 2 includes an edge detector 50, a polarity detector 60, a logic inverter 70, and a data output unit 80, but differs from the configuration of the clock data recovery device 1 in that the clock-generation device 2A is included in place of the clock-generation device 1A. The clock-generation device 2A includes a signal selector 10 that is the same as that of the first embodiment, a coarse phase generator 11 that coarsely adjusts a phase of a feedback clock, and a fine phase generator 12 that finely adjusts the phase of the feedback clock.

Figure 14:
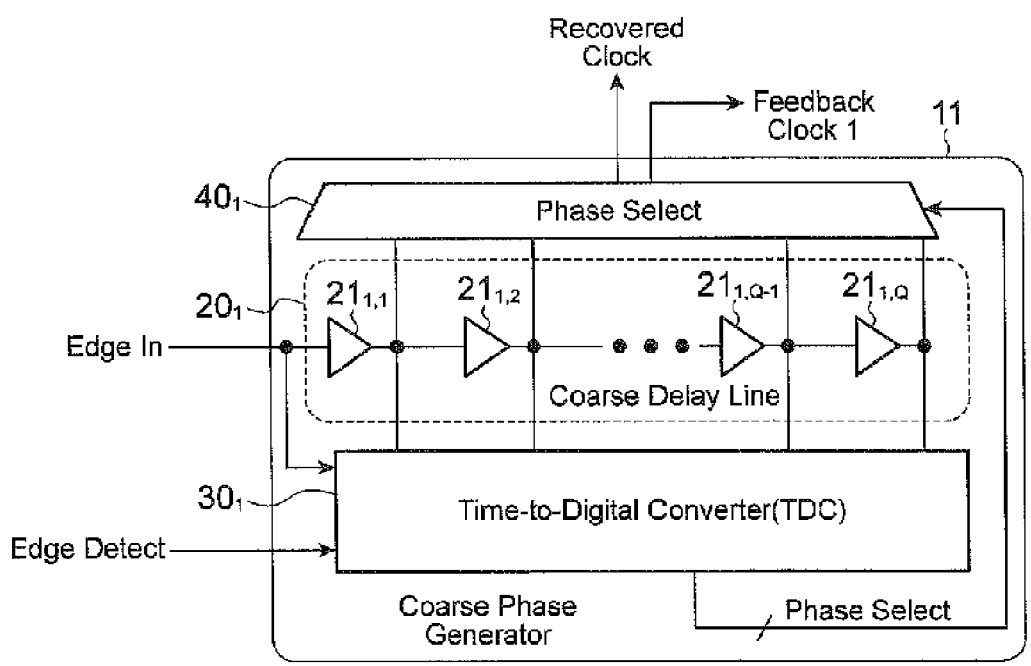
FIG. 14 is a diagram illustrating a configuration of a coarse phase generator 11.

FIG. 14 is a diagram illustrating a configuration of the coarse phase generator 11. The coarse phase generator 11 includes a phase delay unit $20_1$, a time measurement unit $30_1$, and a phase selector $40_1$. The phase delay unit $20_1$ includes a plurality of (Q) cascaded delay elements $21_{1,1}$ to $21_{1,Q}$, as in the phase delay unit 20 of the first embodiment. Among them, the delay element $21_{1,1}$ of a first stage receives a signal Edge In output from the signal selector 10. The time measurement unit $30_1$ measures a unit interval time based on levels of signals output from the respective delay elements $21_{1,1}$ to $21_{1,Q}$ of the phase delay unit $20_1$, as in the time measurement unit 30 of the first embodiment. The phase selector $40_1$ selects the signal output from the delay element in a position corresponding to the unit interval time measured by the time measurement unit $30_1$ among the delay elements $21_{1,1}$ to $21_{1,Q}$ of the phase delay unit $20_1$, and outputs the signal as a feedback clock (Feedback Clock 1) to the fine phase generator 12, as in the phase selector 40 of the first embodiment.

Figure 15:
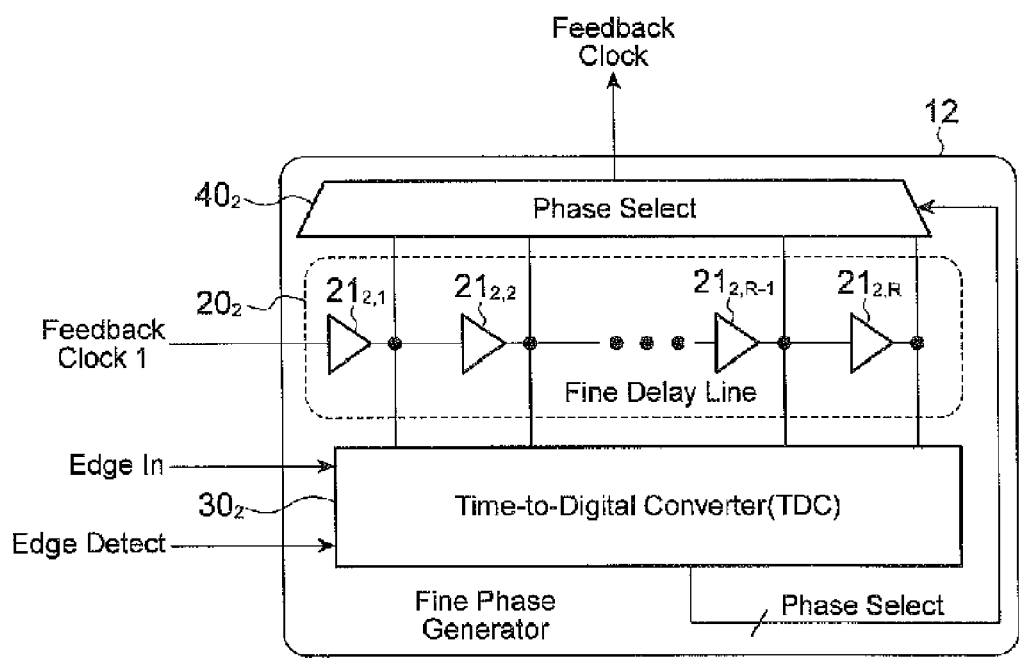
FIG. 15 is a diagram illustrating a configuration of a fine phase generator 12.

FIG. 15 is a diagram illustrating a configuration of the fine phase generator 12. The fine phase generator 12 includes a phase delay unit $20_2$, a time measurement unit $30_2$, and a phase selector $40_2$. The phase delay unit $20_2$ includes a plurality of (R) cascaded delay elements $21_{2,1}$ to $21_{2,R}$, as in the phase delay unit 20 of the first embodiment. Among them, the delay element $21_{2,1}$ of a first stage receives the feedback clock (Feedback Clock 1) output from the phase selector $40_1$ of the coarse phase generator 11. The time measurement unit $30_2$ measures a unit interval time based on levels of the signals output from the respective delay elements $21_{2,1}$ to $21_{2,R}$ of the phase delay unit $20_2$, as in the time measurement unit 30 of the first embodiment. The phase selector $40_2$ selects the signal output from the delay element in a position corresponding to the unit interval time measured by the time measurement unit $30_2$ among the delay elements $21_{2,1}$ to $21_{2,R}$ of the phase delay unit $20_2$, and outputs the signal to the signal selector 10 and the polarity detector 60 as a feedback clock Feedback Clock, as in the phase selector 40 of the first embodiment.

The signal selector 10 receives the feedback clock output from the phase selector $40_2$ of the fine phase generator 12. In the phase delay unit $20_1$ of the coarse phase generator 11, the signal output from the signal selector 10 is input to the delay element $21_{1,1}$ of the first stage. In the phase delay unit $20_2$ of the fine phase generator 12, the feedback clock output from the phase selector $40_1$ of the coarse phase generator 11 is input to the delay element $21_{2,1}$ of the first stage. Accordingly, a feedback route for the feedback clock is formed.

A period of the feedback clock is a clock according to a sum of the delay time coarsely adjusted by the phase delay unit $20_1$ of the coarse phase generator 11 and the delay time finely adjusted by the phase delay unit $20_2$ of the fine phase generator 12. The delay time of each delay element of the phase delay unit $20_1$ of the coarse phase generator 11 is longer than the delay time of each delay element of the phase delay unit $20_2$ of the fine phase generator 12. Accordingly, the coarse phase generator 11 is able to coarsely adjust the phase of the feedback clock, and the fine phase generator 12 is able to finely adjust the phase of the feedback clock. The delay time in the phase delay unit $20_1$ of the coarse phase generator 11 may be set to be slightly shorter than the unit interval time (shorter by the delay time of several delay elements), and a difference therebetween may be finely adjusted as the delay time in the phase delay unit $20_2$ of the fine phase generator 12.

The phase selector $40_1$ of the coarse phase generator 11 selects the signal output from any delay element among the delay elements $21_{1,1}$ to $21_{1,Q}$ of the phase delay unit $20_1$, and outputs this signal to the data output unit 80 as the recovered clock Recovered Clock at a frequency corresponding to a bit rate of the edge signal.

Figure 16:
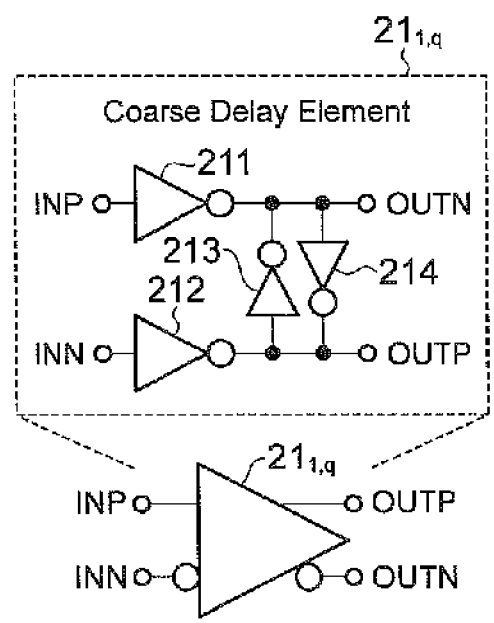
FIG. 16 is a diagram illustrating a circuit configuration example of each delay element $21_{1,q}$ of a phase delay unit $20_1$ of the coarse phase generator 11.
Figure 17:
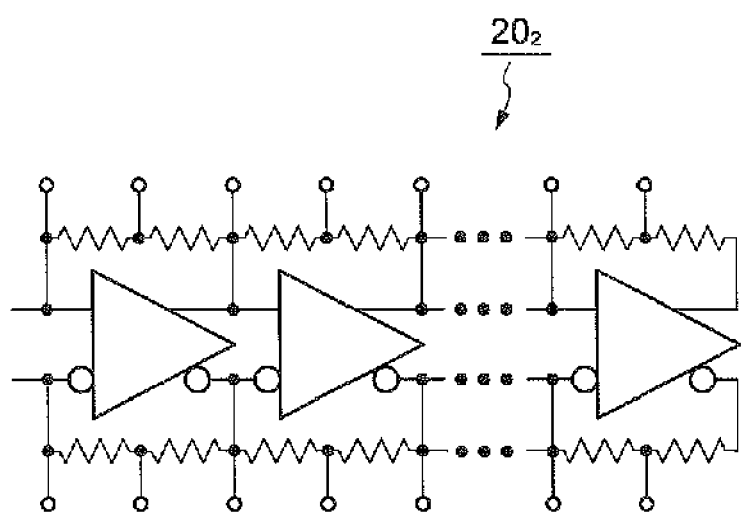
FIG. 17 is a diagram illustrating a circuit configuration example of each delay element $21_{2,r}$ of a phase delay unit $20_2$ of the fine phase generator 12.

FIG. 16 is a diagram illustrating a circuit configuration example of each delay element $21_{1,q}$ of the phase delay unit $20_1$ of the coarse phase generator 11. FIG. 17 is a diagram illustrating a circuit configuration example of each delay element $21_{2,r}$ of the phase delay unit $20_2$ of the fine phase generator 12. In FIGS. 16 and 17, circuit configurations in which each delay element inputs and outputs a differential signal are illustrated.

Each delay element $21_{1,q}$ of the phase delay unit $20_1$ of the coarse phase generator 11 illustrated in FIG. 16 includes two input terminals INP and INN that input a differential signal, two output terminals OUTP and OUTN that output the differential signal, and INV circuits 211 to 214. The INV circuit 211 logically inverts the signal input to the input terminal INP and outputs a resultant signal to the output terminal OUTN. The INV circuit 212 logically inverts the signal input to the input terminal INN and outputs a resultant signal to the output terminal OUTP. An input terminal of the INV circuit 213 is connected to the output terminal OUTP, and an output terminal of the INV circuit 213 is connected to the output terminal OUTN. An input terminal of the INV circuit 214 is connected to the output terminal OUTN, and an output terminal of the INV circuit 214 is connected to the output terminal OUTP. In a configuration of the phase delay unit $20_2$ of the fine phase generator 12 illustrated in FIG. 17, unit circuits illustrated in FIG. 16 are cascaded, and resistor strings connecting the input and output terminals of the unit circuits are provided.

For example, a delay time of each delay element $21_{1,q}$ of the coarse phase generator 11 can be about 35 ps, and a delay time of each delay element $21_{2,r}$ of the fine phase generator 12 can be about 6 ps. Further, the number Q of delay elements of the coarse phase generator 11 can be 18, and the number R of delay elements of the fine phase generator 12 can be 12.

Figure 18:
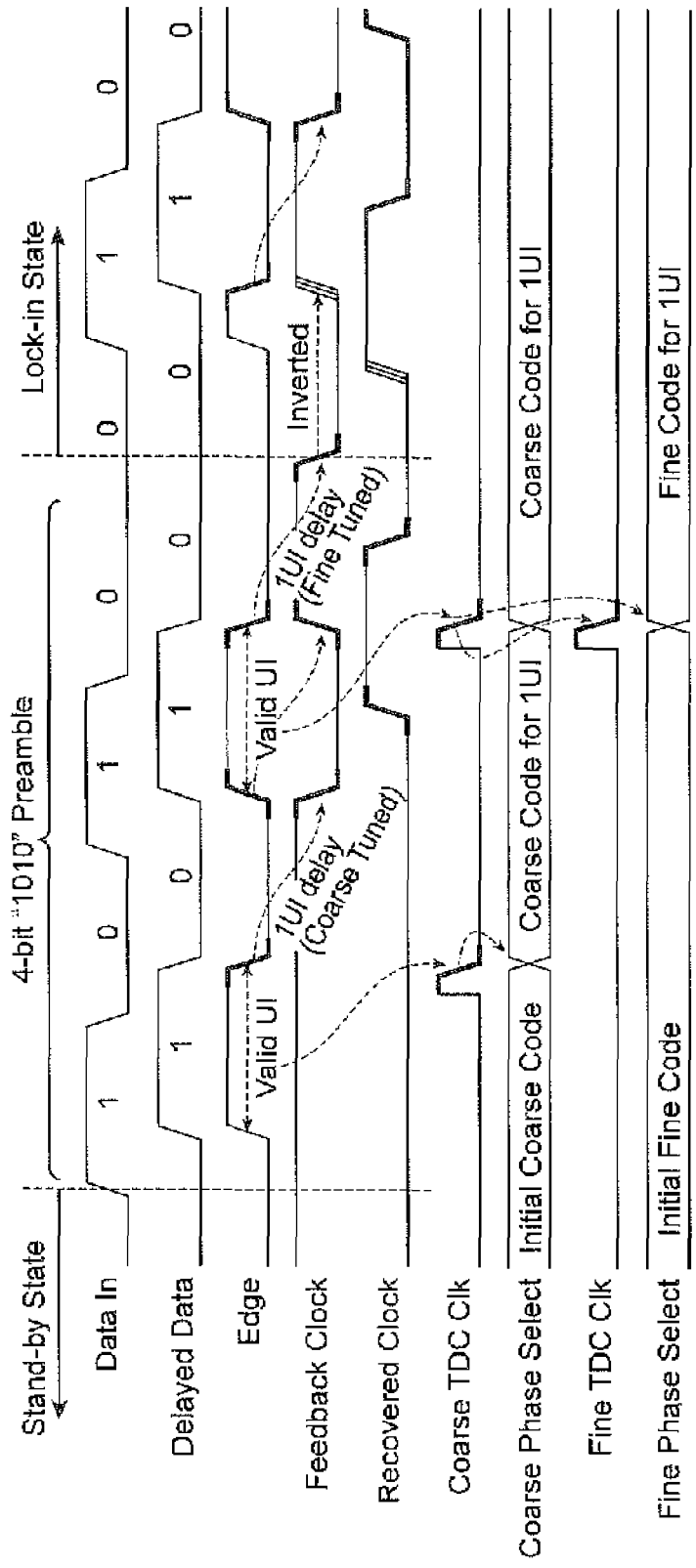
FIG. 18 is a timing chart of respective signals in the clock data recovery device 2 of the second embodiment.

FIG. 18 is a timing chart of respective signals in the clock data recovery device 2 of the second embodiment. The input signal Data In, the delayed input signal Delayed Data, the edge signal Edge, the feedback clock Feedback Clock and the recovered clock Recovered Clock output from the phase selector $40_2$ of the fine phase generator 12, a signal (Coarse TDC Clk) indicating a timing of a latch operation of the time measurement unit $30_1$ of the coarse phase generator 11, a signal (Coarse Phase Select) indicating a unit interval time measured by the time measurement unit $30_1$ of the coarse phase generator 11 and given to the phase selector $40_1$, a signal (Fine TDC Clk) indicating a timing of the latch operation of the time measurement unit $30_2$ of the fine phase generator 12, and a signal (Fine Phase Select) indicating unit interval time measured by the time measurement unit $30_2$ of the fine phase generator 12 and given to the phase selector $40_2$ are illustrated in FIG. 18. Further, a period in which a preamble and normal data are input as input signals is illustrated in FIG. 18.

When 4-bit data [1010] of the preamble is input, the clock data recovery device 2 enters a lock state and is able to obtain the recovered clock and the recovered data based on normal data following the preamble. In this case, a delay amount of the phase delay unit $20_1$ of the coarse phase generator 11 is set at the first falling edge of the preamble, and a delay amount of the phase delay unit $20_2$ of the fine phase generator 12 is set at a second falling edge of the preamble. When there is an edge in the input signal, the clock data recovery device 2 is able to match the phase of the recovered clock Recovered Clock with the phase of the input signal by inputting the edge to the phase delay units $20_1$ and $20_2$.

Further, in the clock data recovery device 2, when there is 3-bit data [010] in the normal data (Normal Data), a unit interval time is measured by the time measurement units $30_1$ and $30_2$, such that a clock oscillation frequency can be adjusted based on this measured unit interval time. Accordingly, it is possible to perform an operation of recovering the clock and the data normally even when characteristics of each delay element of the phase delay units $20_1$ and $20_2$ change due to a change in temperature or voltage during an operation or a bit rate of the input signal slowly changes.

As described above, in the clock data recovery device 2 and the clock-generation device 2A of the second embodiment, since a PLL is unnecessary or a circuit for generating a reference clock is unnecessary, it is possible to reduce a circuit scale and to reduce a manufacturing cost. Further, in the clock data recovery device 2 and the clock-generation device 2A of this embodiment, it is possible to reduce power consumption in the standby period in which there is no signal input. Further, the clock data recovery device 2 of this embodiment can start the recovery of the clock and the data in a short time after the signal input starts.

The clock-generation device 2A of the second embodiment has the following advantages, in comparison with the clock-generation device 1A of the first embodiment.

In the clock-generation device 1A of the first embodiment, since the clock-generation device 1A operates like a ring oscillator when the edge detection signal Edge Detect is at a non-significance level, it is preferable for a total delay time applied to the feedback clock in the phase delay unit 20 to be equal to the unit interval time of the input signal Data In. To realize this, it is preferable for an amount of delay in each delay element 21 of the phase delay unit 20 to be small. Therefore, the number P of delay elements 21 in the phase delay unit 20 tends to increase. For example, when an operation frequency is decreased to ½, the number P of delay elements 21 in the phase delay unit 20 doubles, and the number P of flip flops 31 in the time measurement unit 30 also doubles. Further, when an operation frequency is decreased to ¼, the number P of delay elements 21 in the phase delay unit 20 is quadrupled, and the number P of flip flops 31 in the time measurement unit 30 is also quadrupled. Thus, in the clock-generation device 1A of the first embodiment, if the clock oscillation frequency is to be accurately set when the clock-generation device 1A operates like a ring oscillator, not only does a circuit area increase, but power consumption also increases and a wide range of the operation frequency is limited.

On the other hand, in the clock-generation device 2A of the second embodiment, the delay time in the coarse phase generator 11 including the phase delay unit $20_1$, the time measurement unit $30_1$, and the phase selector $40_1$ is set to be coarsely equal to the unit interval time of the input signal Data In, whereas the amount of delay in the fine phase generator 12 including the phase delay unit $20_2$, the time measurement unit $30_2$, and the phase selector $40_2$ can be finely adjusted. Therefore, in the clock-generation device 2A of the second embodiment, it is possible to prevent increase in the number (Q+R) of the delay elements in the phase delay units $20_1$ and $20_2$ and the number (Q+R) of flip flops in the time measurement units $30_1$ and $30_2$, and to achieve both precision of the clock oscillation frequency and a wide range of the operation frequency while preventing the increase in the circuit area and increase in the power consumption.

Further, in the second embodiment described above, the configuration with two stages including the coarse phase generator 11 (the phase delay unit $20_1$, the time measurement unit $30_1$, and the phase selector $40_1$) and the fine phase generator 12 (the phase delay unit $20_2$, the time measurement unit $30_2$, and the phase selector $40_2$) has been adopted, but a configuration with three or more stages may be adopted.

Other Embodiments

Figure 19:
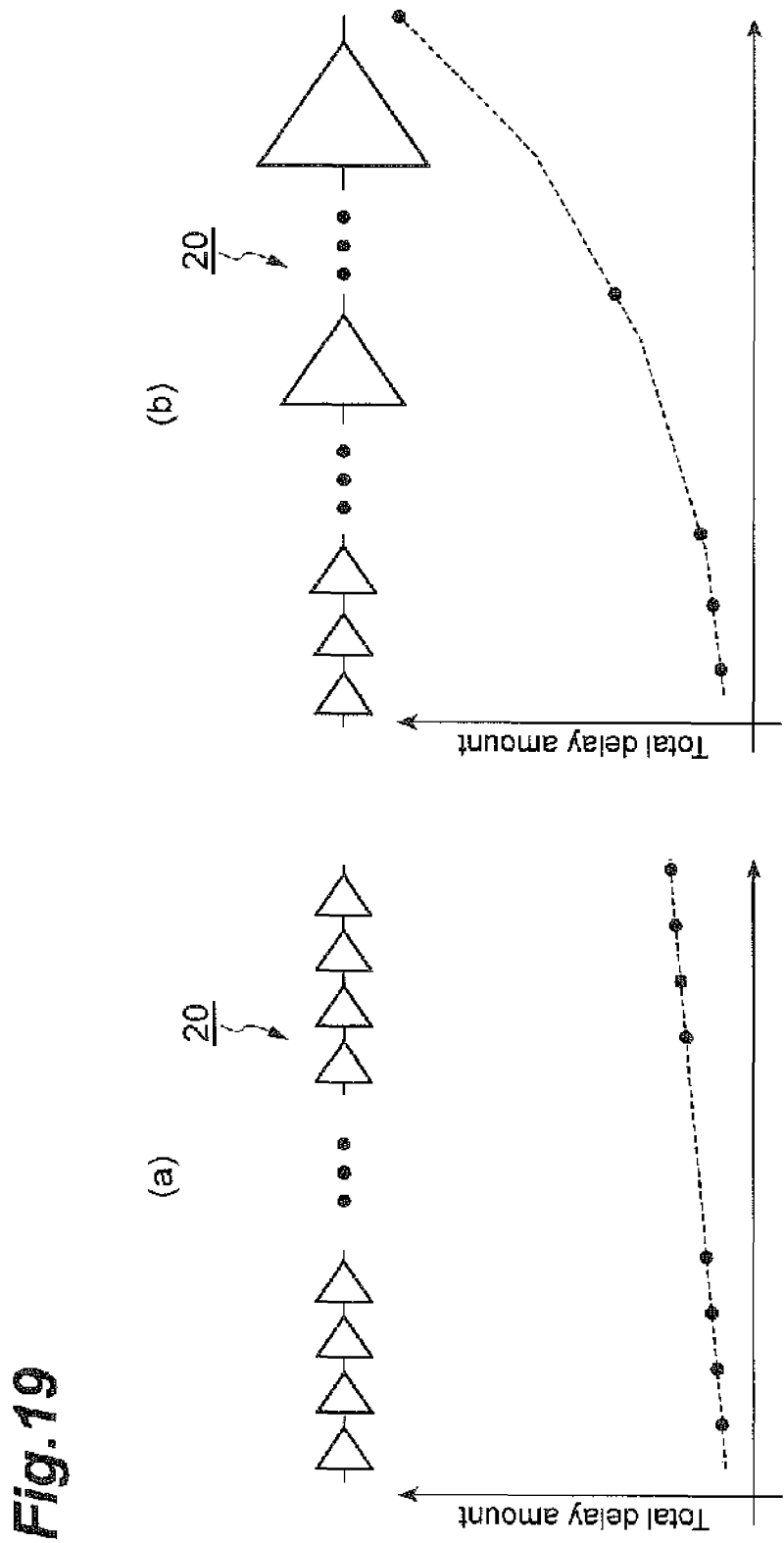
FIG. 19 is a diagram illustrating a delay time of each of a plurality of cascaded delay elements in the phase delay unit 20.

The present invention is not limited to the above-described embodiments, and various modifications are possible. For example, in the respective phase delay units 20, $20_1$, and $20_2$, the delay time of the plurality of delay elements cascaded as illustrated in FIG. 19(a) may be constant, or it is preferable for the delay times of later delay elements among the plurality of delay elements cascaded as illustrated in FIG. 19(b) to be longer. In the latter case, it is preferable for a length of the delay time of each delay element to be set logarithmically with respect to a position of the delay element. As the operation frequency is lower, more delay elements are used and precision may be rough. Accordingly, when the later delay times are lengthened, it is possible to prevent increase in the number of delay elements in the phase delay unit 20 and the number of flip flops in the time measurement unit 30, and to achieve both precision of the clock oscillation frequency and a wide range of the operation frequency while preventing the increase in the circuit area and increase in the power consumption.

INDUSTRIAL APPLICABILITY

The clock-generation device and the clock data recovery device are applicable to reduction of a circuit scale.

REFERENCE SIGNS LIST 1, 2 clock data recovery device
1A, 2A clock-generation device
10 signal selector
11 coarse phase generator
12 fine phase generator
20, $20_1$, $20_2$ phase delay unit
$21_1$ to $21_P$, $21_{1,1}$ to $21_{1,Q}$, $21_{2,1}$ to $21_{2,R}$ delay element
30, $30_1$, $30_2$ time measurement unit
$31_1$ to $31_P$ flip flop
32 measurement permission unit
33 bubble error corrector
40, $40_1$, $40_2$ phase selector
50 edge detector
51 to 53 delay element
54 XOR circuit
60 polarity detector
61, 62 flip flop
63 selector
70 logic inverter
80 data output unit
81, 82 flip flop

The invention claimed is:

1. A clock-generation device comprising:
a signal selector that receives a feedback clock, an edge signal having an edge at a timing according to a bit rate, and an edge detection signal that is at a significance level over a certain period of time including a timing of the edge of the edge signal, selects and outputs the edge signal when the edge detection signal is at the significance level, and selects and outputs a signal obtained by logically inverting the feedback clock when the edge detection signal is at a non-significance level;
a phase delay unit including a plurality of cascaded delay elements, the signal output from the signal selector being input to the delay element of a first stage among the plurality of delay elements, and signals having amounts of delay according to respective positions being output from the plurality of respective delay elements;
a time measurement unit that measures a unit interval time from a timing of a certain edge of the edge signal to a timing of an edge when a time corresponding to one bit lapses, based on levels of the signals output from the plurality of respective delay elements; and
a phase selector that selects the signal output from the delay element in a position corresponding to the unit interval time measured by the time measurement unit among the plurality of delay elements, outputs the signal as the feedback clock, selects the signal output from any delay element among the plurality of delay elements, and outputs the signal as a clock at a frequency corresponding to the bit rate of the edge signal.

2. The clock-generation device according to claim 1, comprising:
phase delay units $D_1$ to $D_N$ as the phase delay unit, time measurement units $M_1$ to $M_N$ as the time measurement unit, and phase selectors $S_1$ to $S_N$ as the phase selector,
wherein each phase delay unit $D_n$ includes a plurality of cascaded delay elements,
a delay time of each delay element of each phase delay unit $D_n$ is different from a delay time of each delay element of another phase delay unit $D_{n1}$,
each time measurement unit $M_n$ measures the unit interval time based on levels of signals output from the plurality of respective delay elements of the phase delay unit $D_n$,
each phase selector $S_n$ selects the signal output from the delay element in a position corresponding to the unit interval time measured by the time measurement unit $M_n$ among the plurality of delay elements of the phase delay unit $D_n$, and outputs the signal as the feedback clock,
the signal selector receives the feedback clock output from the phase selector $S_N$,
the signal output from the signal selector is input to a delay element of a first stage in the phase delay unit $D_1$,
the feedback clock output from the phase selector $S_{n-1}$ is input to a delay element of a first stage in each phase delay unit $D_n$ other than the phase delay unit $D_1$ among the phase delay units $D_1$ to $D_N$, and
any one phase selector $S_n$ among the phase selectors $S_1$ to $S_N$ selects a signal output from any delay element among the plurality of delay elements in the phase delay unit $D_n$, and outputs the signal as the clock (here, N is an integer equal to or greater than 2, and n and n1 are integers equal to or greater than 1 and equal to or smaller than N).

3. The clock-generation device according to claim 1,
wherein a delay time of the later delay element among the plurality of cascaded delay elements in the phase delay unit is longer.

4. A clock data recovery device that recovers a clock and data based on an input signal, the device comprising:
the clock-generation device according to claim 1;
an edge detector that generates and outputs a delayed input signal obtained by giving a delay to the input signal, generates the edge detection signal that is at the significance level over the certain period of time including a timing of an edge of the delayed input signal, and outputs the edge detection signal to the clock-generation device;
a polarity detector that generates and outputs a logic inversion instruction signal that is at a significance level when polarities of edges of the feedback clock and the delayed input signal are the same as each other during a period in which the edge detection signal is at the significance level;
a logic inverter that outputs a signal obtained by logically inverting the delayed input signal to the clock-generation device as the edge signal when the logic inversion instruction signal is at the significance level, and outputs the delayed input signal to the clock-generation device as the edge signal when the logic inversion instruction signal is at a non-significance level; and
a data output unit that samples and holds data of the delayed input signal at a timing indicated by the clock output from the clock-generation device, and outputs the data,
wherein the clock output from the clock-generation device is output as a recovered clock based on the input signal, and the data output from the data output unit is output as recovered data based on the input signal.

5. A clock data recovery device that recovers a clock and data based on an input signal, the device comprising:
the clock-generation device according to claim 2;
an edge detector that generates and outputs a delayed input signal obtained by giving a delay to the input signal, generates the edge detection signal that is at the significance level over the certain period of time including a timing of an edge of the delayed input signal, and outputs the edge detection signal to the clock-generation device;
a polarity detector that generates and outputs a logic inversion instruction signal that is at a significance level when polarities of edges of the feedback clock and the delayed input signal are the same as each other during a period in which the edge detection signal is at the significance level;
a logic inverter that outputs a signal obtained by logically inverting the delayed input signal to the clock-generation device as the edge signal when the logic inversion instruction signal is at the significance level, and outputs the delayed input signal to the clock-generation device as the edge signal when the logic inversion instruction signal is at a non-significance level; and
a data output unit that samples and holds data of the delayed input signal at a timing indicated by the clock output from the clock-generation device, and outputs the data,
wherein the clock output from the clock-generation device is output as a recovered clock based on the input signal, and the data output from the data output unit is output as recovered data based on the input signal.

6. A clock data recovery device that recovers a clock and data based on an input signal, the device comprising:
- the clock-generation device according to claim 3;
- an edge detector that generates and outputs a delayed input signal obtained by giving a delay to the input signal, generates the edge detection signal that is at the significance level over the certain period of time including a timing of an edge of the delayed input signal, and outputs the edge detection signal to the clock-generation device;
- a polarity detector that generates and outputs a logic inversion instruction signal that is at a significance level when polarities of edges of the feedback clock and the delayed input signal are the same as each other during a period in which the edge detection signal is at the significance level;
- a logic inverter that outputs a signal obtained by logically inverting the delayed input signal to the clock-generation device as the edge signal when the logic inversion instruction signal is at the significance level, and outputs the delayed input signal to the clock-generation device as the edge signal when the logic inversion instruction signal is at a non-significance level; and
- a data output unit that samples and holds data of the delayed input signal at a timing indicated by the clock output from the clock-generation device, and outputs the data,
- wherein the clock output from the clock-generation device is output as a recovered clock based on the input signal, and the data output from the data output unit is output as recovered data based on the input signal.

* * * * *